(12) United States Patent
Poon et al.

(10) Patent No.: US 7,283,200 B2
(45) Date of Patent: Oct. 16, 2007

(54) SYSTEM AND METHOD FOR MEASURING DISPLACEMENT OF A STAGE

(75) Inventors: Alex Ka Tim Poon, San Ramon, CA (US); Leonard Wai Fung Kho, San Francisco, CA (US); Toru Kawaguchi, Saitama (JP); Hisashi Tazawa, Saitama (JP); Saburo Kamiya, Saitama (JP); Yasuhiro Hidaka, Kumagaya (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/623,004

(22) Filed: Jul. 17, 2003

(65) Prior Publication Data

US 2005/0012918 A1    Jan. 20, 2005

(51) Int. Cl.
*G03B 27/42* (2006.01)

(52) U.S. Cl. .................... 355/53; 355/71; 356/400

(58) Field of Classification Search .............. 355/53, 355/67, 71; 356/399–401
See application file for complete search history.

(56) References Cited

U.S. PATENT DOCUMENTS

| | | | | |
|---|---|---|---|---|
| 5,469,260 | A | * | 11/1995 | Takagi et al. ............... 356/500 |
| 5,552,888 | A | * | 9/1996 | Sogard et al. .............. 250/548 |
| 5,757,160 | A | * | 5/1998 | Kreuzer ...................... 318/649 |
| 5,870,197 | A | * | 2/1999 | Sogard et al. ................ 355/30 |
| 6,049,372 | A | * | 4/2000 | Kato et al. ................... 355/53 |
| 6,166,812 | A | * | 12/2000 | Ueda .......................... 356/401 |
| 6,317,196 | B1 | | 11/2001 | Hamada et al. |
| 6,570,641 | B2 | | 5/2003 | Hamada et al. |
| 2001/0046053 | A1 | | 11/2001 | Hill |
| 2002/0008877 | A1 | | 1/2002 | Iwamoto et al. |
| 2002/0122178 | A1 | * | 9/2002 | McMurtry et al. .......... 356/401 |
| 2003/0186136 | A1 | * | 10/2003 | Hill .............................. 430/5 |
| 2004/0135980 | A1 | * | 7/2004 | Hill .............................. 355/52 |

FOREIGN PATENT DOCUMENTS

| | | |
|---|---|---|
| EP | 1168084 A2 | 2/2002 |
| JP | 05-217837 | 8/1993 |
| JP | 10-284416 | 10/1998 |
| JP | 2001-307983 | 11/2001 |

OTHER PUBLICATIONS

Melles Griot Catalog p. 10-9. The Applicants do not know the exact date of the catalog. However, the Applicants believe that the catalog is at least one year old.

\* cited by examiner

*Primary Examiner*—D. Rutledge
(74) *Attorney, Agent, or Firm*—Steven G. Roeder

(57) ABSTRACT

A measurement system (222) for measuring the position of a stage (248) along a first axis includes a first system (260) having a first beam source (260A) that directs a first beam (260H) on a first path that is parallel with a second axis and a first redirector (260D) that redirects the first beam so that the redirected first beam (260H) is on a first redirected path that is parallel with the first axis irrespective to the orientation of the first redirector (260D) about a third axis. The measurement system (222) can include a shield (380) that protects the first beam (260H) from environmental conditions.

60 Claims, 13 Drawing Sheets

SYSTEM AND METHOD FOR MEASURING DISPLACEMENT OF A STAGE

FIELD OF THE INVENTION

The present invention is directed to a system and method for measuring displacement of a stage assembly.

BACKGROUND

Exposure apparatuses are commonly used to transfer images from a reticle onto a semiconductor wafer during semiconductor processing. A typical exposure apparatus includes an illumination source, a reticle stage assembly that retains a reticle, an optical assembly, a wafer stage assembly that retains a semiconductor wafer, a measurement system, and a control system.

Typically, the wafer stage assembly includes a wafer stage that retains the wafer, and a wafer mover assembly that moves the wafer stage and the wafer. Similarly, the reticle stage assembly includes a reticle stage that retains the reticle, and a reticle mover assembly that moves the reticle stage and the reticle.

The size of the images transferred onto the wafer from the reticle is extremely small. Accordingly, the precise relative positioning of the wafer and the reticle is critical to the, manufacturing of high density, semiconductor wafers.

In order to obtain precise relative positioning, the reticle and the wafer are constantly monitored by the measurement system. Stated another way, the measurement system monitors movement of the wafer stage and the reticle stage relative to the optical assembly or some other reference. With this information, the wafer mover assembly can be used to precisely position the wafer and the reticle mover assembly can be used to precisely position the reticle.

For example, for each stage, the measurement system can be an interferometer including an X system for monitoring the position of that stage along an X axis and a Y system for monitoring the position of that stage along a Y axis. Each system can include a mirror that is secured to the stage. If the stage is moved a long distance along the Y axis, the mirror for the X system on the stage needs to be relatively long. Unfortunately, the long mirror can be relatively heavy and can influence the performance of the stage. Additionally, the placement of the long mirror on the stage can interfere with the design of the stage.

In light of the above, there is a need for a measurement system that measures the displacement of a stage. Additionally, there is a need for a method and system for accurately measuring the position of the stage. Moreover, there is a need for an exposure apparatus capable of manufacturing precision devices such as high density, semiconductor wafers.

SUMMARY

The present invention is directed to a measurement system for measuring the position of a stage along a first axis. In one embodiment, the measurement system includes a first system having a beam source that directs a beam on a path that is parallel with a second axis and a redirector that redirects the beam so that the redirected beam is on a redirected path that is parallel with the first axis irrespective to the orientation of the redirector about a third axis. In this embodiment, for example, the redirector can include a penta-prism.

Moreover, the measurement system can include a reflector that is positioned away from the stage. In this embodiment, the redirector redirects the beam at the reflector and the reflector reflects the beam back to the redirector.

In another embodiment, the measurement system includes a shield that protects the beam from environmental conditions that may influence the beam. As an example, the shield can include a shield aperture and the beam can be directed through the shield aperture.

The present invention is also directed to a stage assembly, an exposure apparatus, a wafer, a device, a method for measuring displacement of a stage, a method for making a stage assembly, a method for making an exposure apparatus, a method for making a device, and a method for manufacturing a wafer.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1:
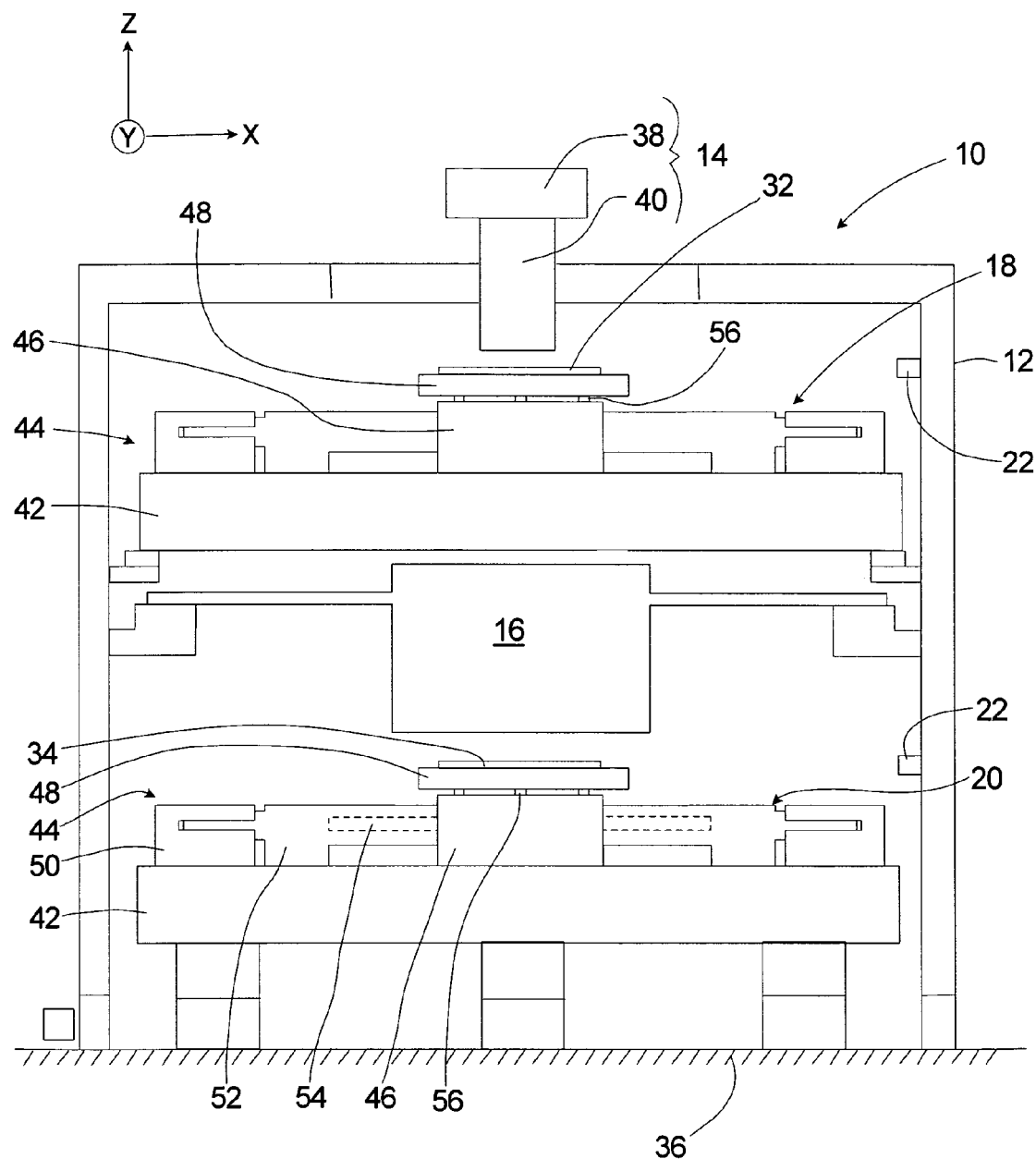
FIG. 1 is a side illustration of a precision assembly having features of the present invention.

FIG. 1 is a schematic illustration of a precision assembly, namely an exposure apparatus 10 having features of the present invention. The exposure apparatus 10 includes an apparatus frame 12, an illumination system 14 (irradiation apparatus), an optical assembly 16, a reticle stage assembly 18, a wafer stage assembly 20, a measurement system 22, and a control system 24. The design of the components of the exposure apparatus 10 can be varied to suit the design requirements of the exposure apparatus 10.

A number of Figures include an orientation system that illustrates an X axis, a Y axis that is orthogonal to the X axis and a Z axis that is orthogonal to the X and Y axes. It should be noted that these axes can also be referred to as the first, second and third axes.

The exposure apparatus 10 is particularly useful as a lithographic device that transfers a pattern (not shown) of an integrated circuit from a reticle 32 onto a semiconductor wafer 34. The exposure apparatus 10 mounts to a mounting base 36, e.g., the ground, a base, or floor or some other supporting structure.

There are a number of different types of lithographic devices. For example, the exposure apparatus 10 can be used as a scanning type photolithography system that exposes the pattern from the reticle 32 onto the wafer 34 with the reticle 32 and the wafer 34 moving synchronously. In a scanning type lithographic device, the reticle 32 is moved perpendicularly to an optical axis of the optical assembly 16 by the reticle stage assembly 18 and the wafer 34 is moved perpendicularly to the optical axis of the optical assembly 16 by the wafer stage assembly 20. Scanning of the reticle 32 and the wafer 34 occurs while the reticle 32 and the wafer 34 are moving synchronously.

Alternatively, the exposure apparatus 10 can be a step-and-repeat type photolithography system that exposes the reticle 32 while the reticle 32 and the wafer 34 are stationary. In the step and repeat process, the wafer 34 is in a constant position relative to the reticle 32 and the optical assembly 16 during the exposure of an individual field. Subsequently, between consecutive exposure steps, the wafer 34 is consecutively moved with the wafer stage assembly 20 perpendicularly to the optical axis of the optical assembly 16 so that the next field of the wafer 34 is brought into position relative to the optical assembly 16 and the reticle 32 for exposure. Following this process, the images on the reticle 32 are sequentially exposed onto the fields of the wafer 34, and then the next field of the wafer 34 is brought into position relative to the optical assembly 16 and the reticle 32.

However, the use of the exposure apparatus 10 provided herein is not limited to a photolithography system for semiconductor manufacturing. The exposure apparatus 10, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern from a mask to a substrate with the mask located close to the substrate without the use of a lens assembly.

The apparatus frame 12 is rigid and supports some of the components of the exposure apparatus 10. The apparatus frame 12 illustrated in FIG. 1 supports the reticle stage assembly 18, the optical assembly 16 and the illumination system 14 above the mounting base 36.

The illumination system 14 includes an illumination source 38 and an illumination optical assembly 40. The illumination source 38 emits a beam (irradiation) of light energy. The illumination optical assembly 40 guides the beam of light energy from the illumination source 38 to the optical assembly 16. The beam illuminates selectively different portions of the reticle 32 and exposes the wafer 34. In FIG. 1, the illumination source 38 is illustrated as being supported above the reticle stage assembly 18. Typically, however, the illumination source 38 is secured to one of the sides of the apparatus frame 12 and the energy beam from the illumination source 38 is directed to above the reticle stage assembly 18 with the illumination optical assembly 40.

The illumination source 38 can be a g-line source (436 nm), an i-line source (365 nm), a KrF excimer laser (248 nm), an ArF excimer laser (193 nm) or a $F_2$ laser (157 nm). Alternatively, the illumination source 38 can generate charged particle beams such as an x-ray or an electron beam. For instance, in the case where an electron beam is used, thermionic emission type lanthanum hexaboride ($LaB_6$) or tantalum (Ta) can be used as a cathode for an electron gun. Furthermore, in the case where an electron beam is used, the structure could be such that either a mask is used or a pattern can be directly formed on a substrate without the use of a mask.

The optical assembly 16 projects and/or focuses the light passing through the reticle 32 to the wafer 34. Depending upon the design of the exposure apparatus 10, the optical assembly 16 can magnify or reduce the image illuminated on the reticle 32. The optical assembly 16 need not be limited to a reduction system. It could also be a 1× or magnification system.

When far ultra-violet rays such as the excimer laser is used, glass materials such as quartz and fluorite that transmit far ultra-violet rays can be used in the optical assembly 16. When the $F_2$ type laser or x-ray is used, the optical assembly 16 can be either catadioptric or refractive (a reticle should also preferably be a reflective type), and when an electron beam is used, electron optics can consist of electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No.8-171054 published in the Official Gazette for Laid-Open Patent Applications and its counterpart U.S. Pat. No. 5,668,672, as well as Japan Patent Application Disclosure No.10-20195 and its counterpart U.S. Pat. No. 5,835,275. In these cases, the reflecting optical device can be a catadioptric optical system incorporating a beam splitter and concave mirror. Japan Patent Application Disclosure No.8-334695 published in the Official Gazette for Laid-Open Patent Applications and its counterpart U.S. Pat. No. 5,689,377 as well as Japan Patent Application Disclosure No.10-3039 and its counterpart U.S. patent application Ser. No. 873,605 (Application Date: Jun. 12, 1997) also use a reflecting-refracting type of optical system incorporating a concave mirror, etc., but without a beam splitter, and can also be employed with this invention. As far as is permitted, the disclosures in the above-mentioned U.S. patents, as well as the Japan patent applications published in the Official Gazette for Laid-Open Patent Applications are incorporated herein by reference.

The reticle stage assembly 18 holds and positions the reticle 32 relative to the optical assembly 16 and the wafer 34. Somewhat similarly, the wafer stage assembly 20 holds and positions the wafer 34 with respect to the projected image of the illuminated portions of the reticle 32. The wafer stage assembly 20 is described in more detail below.

In this embodiment, each stage assembly 18, 20 includes a stage base 42, a stage mover assembly 44, a first stage 46, and a second stage 48. In FIG. 1, the stage base 42 for each stage assembly 18, 20 is generally rectangular shaped. The stage mover assembly 44 controls and moves the stages 46, 48 of each stage assembly 18, 20. For example, the stage mover assembly 44 can move the stages 46, 48 with three degrees of freedom, less than three degrees of freedom, or six degrees of freedom relative to the stage base 42. The stage mover assembly 44 can include one or more movers, such as rotary motors, voice coil motors, linear motors utilizing a Lorentz force to generate drive force, electromagnetic movers, planar motor, or some other force movers.

In FIG. 1, for each stage assembly 18, 20, the stage mover assembly 44 includes a pair of spaced apart Y stage movers 50, a guide bar 52, and a X stage mover 54 (illustrated in phantom). The Y stage movers 50 move the guide bar 52, and the stages 46, 48 with a relatively large displacement along the Y axis and with a limited range of motion about the Z axis, and the X stage mover 54 moves the stages 46, 48 along the X axis relative to the guide bar 52.

The design of each stage mover 50, 54 can be varied to suit the movement requirements of the stage assembly 18, 20. In the embodiment illustrated in FIG. 1, each of the movers 50, 54 is a linear motor.

The guide bar 52 guides the movement of the stages 46, 48 along the X axis. In FIG. 1, the guide bar 52 is somewhat rectangular beam shaped. A bearing (not shown) maintains the guide bar 52 spaced apart along the Z axis relative to the stage base 42 and allows for motion of the guide bar 52 along the Y axis and about the Z axis relative to the stage base 42. The bearing, for example, can be a vacuum preload type fluid bearing, a magnetic type bearing or a ball bearing type assembly.

In FIG. 1, the stages 46, 48 move with the guide bar 52 along the Y axis and about the Z axis and the stages 46, 48 move along the X axis relative to the guide bar 52. In this embodiment, the first stage 46 is generally rectangular shaped and includes a rectangular shaped opening for receiving the guide bar 52. A bearing (not shown) maintains the first stage 46 spaced apart along the Z axis relative to the stage base 42 and allows for motion of the first stage 46 along the X axis, along the Y axis and about the Z axis relative to the stage base 42. Further, a bearing (not shown) allows the first stage 46 to move along the guide bar 52. The bearings, for example, can be a vacuum preload type fluid bearing, a magnetic type bearing or a ball bearing type assembly.

The second stage 48 is generally rectangular plate shaped and includes a clamp that retains either the wafer 34 or the reticle 32. In FIG. 1, the stage mover assembly 44 includes a fine mover assembly 56 that moves and adjusts the position of the second stage 48 relative to the first stage 46. The fine mover assembly 56 can include one or more rotary motors, voice coil motors, linear motors utilizing a Lorentz force to generate drive force, electromagnetic movers, or some other force movers.

In one embodiment, the fine mover assembly 56 can adjust the position of the second stage 48 relative to the first stage 46 with six degrees of freedom. Alternatively, for example, the fine mover assembly 56 can move the second stage 48 relative to the first stage 46 with only three degrees of freedom. Still alternatively, the second stage 48 can be fixedly secured to the first stage 46 and can move concurrently with the first stage 46.

Further, in photolithography systems, when linear motors (see U.S. Pat. Nos. 5,623,853 or 5,528,118) are used in a wafer stage or a mask stage, the linear motors can be either an air levitation type employing air bearings or a magnetic levitation type using Lorentz force or reactance force. Additionally, the stage could move along a guide, or it could be a guideless type stage that uses no guide. As far as is permitted, the disclosures in U.S. Pat. Nos. 5,623,853 and 5,528,118 are incorporated herein by reference.

Alternatively, one of the stages could be driven by a planar motor, which drives the stage by an electromagnetic force generated by a magnet unit having two-dimensionally arranged magnets and an armature coil unit having two-dimensionally arranged coils in facing positions. With this type of driving system, either the magnet unit or the armature coil unit is connected to the stage and the other unit is mounted on the moving plane side of the stage.

Movement of the stages as described above generates reaction forces that can affect performance of the photolithography system. Reaction forces generated by the wafer (substrate) stage motion can be mechanically transferred to the floor (ground) by use of a frame member as described in U.S. Pat. No. 5,528,100 and published Japanese Patent Application Disclosure No. 8-136475. Additionally, reaction forces generated by the reticle (mask) stage motion can be mechanically transferred to the floor (ground) by use of a frame member as described in U.S. Pat. No. 5,874,820 and published Japanese Patent Application Disclosure No. 8-330224. As far as is permitted, the disclosures in U.S. Pat. Nos. 5,528,100 and 5,874,820 and Japanese Patent Application Disclosure No. 8-330224 are incorporated herein by reference.

The measurement system 22 monitors the position of each second stage 48 of the reticle stage assembly 18 and the wafer stage assembly 20 relative to the optical assembly 16 or some other reference. With this information, the control system 24 directs current to the stage mover assembly 44 of each stage assembly 18, 20 to precisely position each second stage 48. For example, the measurement system 22 can utilize multiple laser interferometers, encoders, and/or other measuring devices. A detailed description of a number of different embodiments of the measurement system 22 is described below.

The control system 24 is connected to the measurement system 22 and the stage mover assemblies 18, 20. The control system 24 receives information from the measurement system 22 and controls the stage mover assemblies 18, 20 to precisely position the reticle 32 and the wafer 34. The control system 24 can include one or more processors and circuits for performing the functions described herein.

A photolithography system (an exposure apparatus) according to the embodiments described herein can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

Figure 2A:
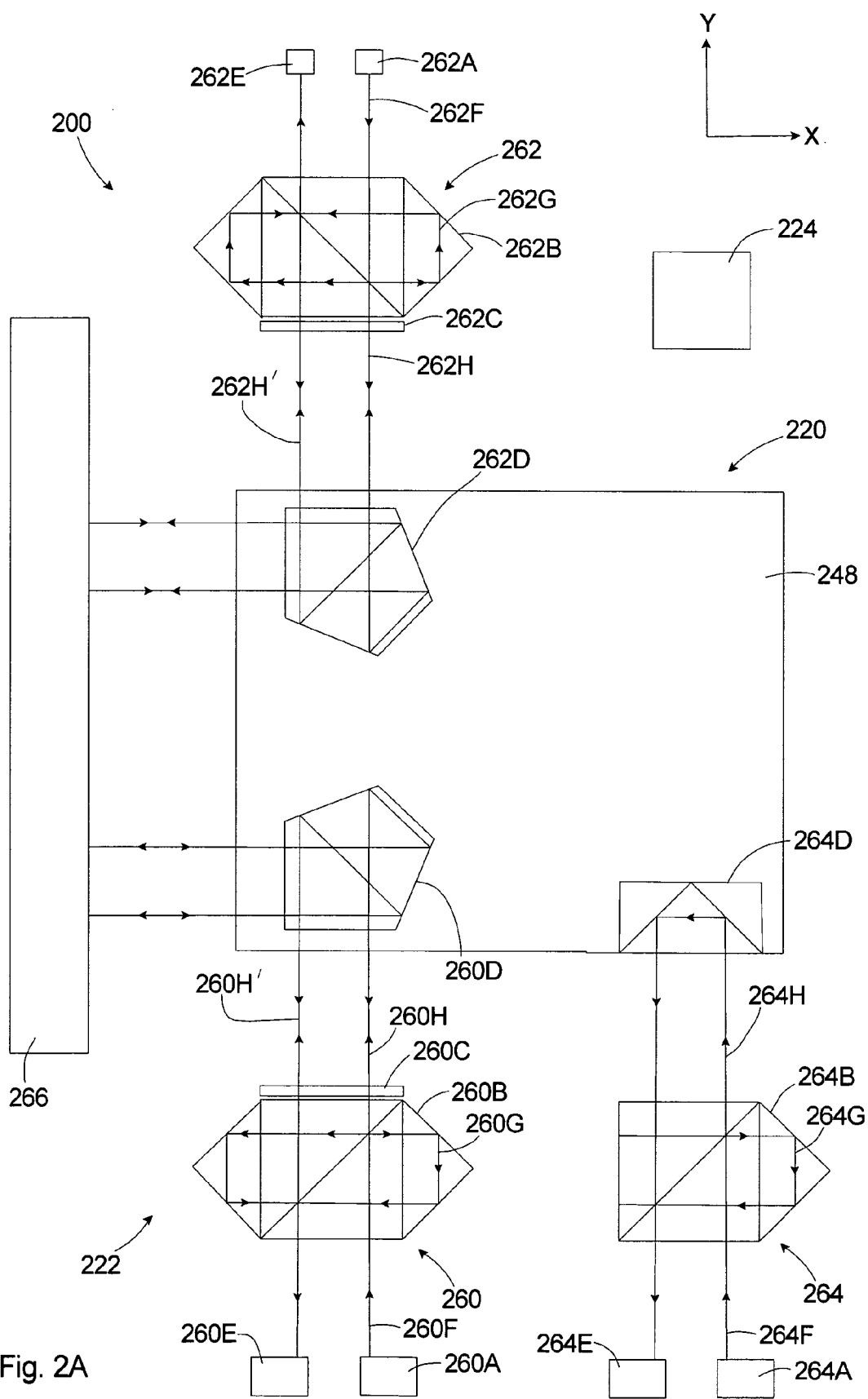
FIG. 2A is a simplified top plan illustration of an embodiment of a stage and a measurement system having features of the present invention.

FIG. 2A is a simplified illustration of a combination 200 including a stage 248 of a stage assembly 220 that is used to position a device (not shown in FIG. 2A), a portion of a measurement system 222, and a control system 224 having features of the present invention. For example, the stage assembly 220 can be used as the wafer stage assembly 20 or the reticle stage assembly 18 in the exposure apparatus 10 of FIG. 1. Further, the stage 248 can be used as the second stage 48 of the wafer stage assemblies 20 or the reticle stage assembly 18 in the exposure apparatus 10 of FIG. 1. Alternatively, the stage assembly 220 can be used to move other types of devices during manufacturing and/or inspection, to move a device under an electron microscope (not shown), or to move a device during a precision measurement operation (not shown).

The stage mover assembly is not illustrated in FIG. 2A. For example, the stage mover assembly can move the stage 248 along the X axis, along the Y axis and about the Z axis. In this embodiment, the stage 248 is moved a long distance along the Y axis and moved a short distance along the X axis. Additionally, the stage mover assembly can move the stage 248 along the Z axis, about the X axis and about the Y axis.

The design of the measurement system 222 can vary. For example, the measurement system 222 can measure the position of the stage 248 along at least one axis and/or about at least one axis. In the embodiment illustrated in FIG. 2A, the measurement system 222 measures the position of the stage 248 along two axes and about one axis. More specifically, the measurement system 222 measures the position of the stage 248 along the X axis, along the Y axis, and about the Z axis. Alternatively, for example, (i) the measurement system could be designed to measure the position of the stage along the Y and Z axes and about the X axis, (ii) the measurement system could be designed to measure the position of the stage along the Y and Z axes and about the Y axis, or (iii) the measurement system could be designed to measure the position of the stage along the X, Y and Z axes and about the X, Y, and Z axes. Many configurations of the measurement system can be arranged.

The design of the components of the measurement system 222 can be varied. In FIG. 2A, the measurement system 222 includes a first X system 260, a second X system 262 and a Y system 264. In this embodiment, the X systems 260, 262 are used in conjunction with the Y system 264 to measure the position of the stage 248 along the X axis and about the Z axis. More specifically, each X system 260, 262 independently measures the sum of X and Y displacements of the stage 248 and the Y system 264 measures the Y displacement of the stage 248. Accordingly, in this embodiment, Y displacement from the Y system 264 has to be subtracted from the sum of the X and Y displacements measured by the X systems 260, 262 to obtain X displacement and the theta Z displacement of the stage 248.

It should be noted that two X systems 260, 262 are used in this layout to minimize abbe error caused by the difference in the measurement point to the rotation point of the stage 248. Alternatively, for example, a single X system and two Y systems can be utilized.

In FIG. 2A, each system 260, 262, 264 is a laser interferometer type system. Alternatively, for example, one or more of the systems 260, 262, 264 can be another type of measuring device, such as an encoder. Additionally, in this embodiment, each X system 260, 262 is a double pass system.

In the embodiment illustrated in FIG. 2A, (i) the first X system 260 includes a first X beam source 260A, a first X optical unit 260B, a first X wave plate 260C, a first X redirector 260D, and a first X detector 260E; (ii) the second X system 262 includes a second X beam source 262A, a second X optical unit 262B, a second X wave plate 262C, a second X redirector 262D, and a second X detector 262E; and (iii) the Y system 264 includes a Y beam source 264A, a Y optical unit 264B, a Y reflector 264D, and a Y detector 264E. Additionally, in this embodiment, the X systems 260, 262 share a common X reflector 266. Alternatively, for example, each X system 260, 262 could include a separate X reflector.

The first X beam source 260A generates a first X beam 260F along a first path that is directed parallel to the Y axis at the first X optical unit 260B. The first optical unit 260B splits the first X laser beam 260F into a first X reference beam 260G and a first X measurement beam 260H. The first X reference beam 260G is reflected within the first X optical unit 260B and redirected to the first X detector 260E. The first X measurement beam 260H is directed along the first path parallel to the Y axis through the first X wave plate 260C to the first X redirector 260D. The first X redirector 260D redirects the first X measurement beam 260H along a redirected path that is 90° with respect to the first path and towards the X reflector 266. The redirected path is parallel to the X axis. The X reflector 266 reflects the first X measurement beam 260H 180° along the X axis back toward the first X redirector 260D. Subsequently, the first X redirector 260D redirects the first X measurement beam 260H directed along the X axis 90° so that the first X measurement beam 260H is directed along the Y axis at the first X optical unit 260B. The first X optical unit 260B reflects the first X measurement beam 260H and redirects the first X measurement beam 260H back to the first X redirector 260D as a first X measurement beam 260H'. The first X redirector 260D redirects the first X measurement beam 260H' 90° with respect to the incoming beam along the X axis and towards the X reflector 266. The X reflector 266 reflects the first X measurement beam 260H' 180° along the X axis toward the first X redirector 260D. Subsequently, the first X redirector 260D redirects the first X measurement beam 260H' directed along the X axis 90° so that the first X measurement beam 260H' is directed along the Y axis at the first X optical unit 260B. The first X measurement beam 260H' passes through the first optical unit 260B and is directed to the first X detector 260E. The first X detector 260E detects an interference beam of the first X reference beam 260G and the first X measurement beam 260H'.

The second X beam source 262A generates a second X beam 262F along a second path that is directed substantially parallel to the Y axis, 180° from the first X beam 260F, at the second X optical unit 262B. The second optical unit 262B splits the second X beam 262F into a second X reference beam 262G and a second X measurement beam 262H. The axes of the measurement beams 260H and 262H are on the same axis that extends along the Y axis. The second X reference beam 262G is reflected within the second X optical unit 262B and redirected to the second X detector 262E. The second X measurement beam 262H is directed along the second path parallel to the Y axis through the second X wave plate 262C to the second X redirector 262D. The second X redirector 262D redirects the second X measurement beam 262H along a redirected path that is 90° with respect to the second path and towards the X reflector 266. The redirected path is parallel to the X axis. The X reflector 266 reflects the second X measurement beam 262H 180° along the X axis back toward the second X redirector 262D. Subsequently, the second X redirector 262D redirects the second X measurement beam 262H directed along the X axis 90° so that the second X measurement beam 262H is directed along the Y axis at the second X optical unit 262B. The second X optical unit 262B reflects the second X measurement beam 262H and redirects the second X measurement beam 262H back to the second X redirector 262D as a second X measurement beam 262H'. The second X redirector 262D redirects the second X measurement beam 262H' 90° with respect to the incoming beam along the X axis and towards the X reflector 266. The X reflector 266 reflects the second X measurement beam 262H' 180° along the X axis toward the second X redirector 262D. Subsequently, the second X redirector 262D redirects the second X measurement beam 262H' directed along the X axis 90 so that the second X measurement beam 262H' is directed along the Y axis at the second X optical unit 262B. The second X measurement beam 262H' passes through the second optical unit 262B and is directed to the second X detector 262E. The second X detector 262E detects an interference beam of the second X reference beam 262G and the second X measurement beam 262H'.

The Y beam source 264A generates a Y beam 264F that is directed parallel along the Y axis at the Y optical unit 264B. The Y optical unit 264B splits the Y laser beam 264F into a Y reference beam 264G and a Y measurement beam 264H. The Y reference beam 264G is reflected within the Y optical unit 264B and redirected to the Y detector 264E. The Y measurement beam 264H is directed parallel to the Y axis to the Y reflector 264D. The Y reflector 264D redirects the Y measurement beam 264H 180° degrees with respect to the incoming beam along the Y axis and towards the Y optical unit 264B. The Y measurement beam 264H passes through the Y optical unit 264B and is directed to the Y detector 264E. The Y detector 264E detects an interference beam of the Y reference beam 264G and the Y measurement beam 264H.

In FIG. 2A, the beam sources 260A, 262A, 264A, the optical units 260B, 262B, 264B, the wave plates 260C, 262C, and the detectors 260E, 262E, 264E are positioned away from the stage 248 and can be secured to the apparatus frame 12 (illustrated in FIG. 1) or the optical assembly 16 (illustrated in FIG. 1), as examples.

FIG. 2A includes three separate beam sources 260A, 262A, 264A. Alternatively, for example, a single beam source can be used to generate two or more of the beams 260F, 262F, 264F. In one embodiment, each beam 260F, 262F, 264F is a laser beam.

Each optical unit 260B, 262B, 264B can include one or more optical elements, and each wave plate 260C, 262C, is a ¼ wave plate that polarizes the respective measurement beam 260H, 262H.

In one embodiment, each X redirector 260D, 262D is somewhat insensitive to rotation of the stage 248 around the Z axis, and incoming beams parallel to the Y-axis will result in a redirected beam parallel to the X-axis irrespective to the orientation of the stage 248 and the X redirector 260D, 262D about the Z axis. Stated another way, the X redirectors 260D, 262D redirect the respective X measurement beam 260H, 262H 90° with respect to the incoming beams. In FIG. 2A, each of the X redirectors 260D, 262D is secured directly to and moves with the stage 248.

The design and location of the X reflector 266 can vary. In one embodiment, the X reflector 266 is a rectangular shaped, bar type mirror that is positioned off of and remote to the stage 248. In this embodiment, the X reflector 266 is secured to a fixed location and the stage 248 moves relative to the stationary X reflector 266. For example, the X reflector 266 can be fixed to the optical assembly 16 (illustrated in FIG. 1) or the apparatus frame 12 (illustrated in FIG. 1). Additionally, the X reflector 266 can be positioned along a path that is parallel with the Y axis.

In this embodiment, because the X reflector 266 is not positioned on the stage 248, the size and weight of the stage 248 can be reduced. Moreover, this allows for more freedom in the overall layout of the stage assembly 220, and the use of smaller motors in the stage mover assembly 44 (illustrated in FIG. 1).

The Y reflector 264D redirects the Y measurement beam 264H along the Y axis towards the Y detector 264E. The design of the Y reflector 264D can vary. For example, the Y reflector 264D can be a bar mirror or corner cube.

In FIG. 2A, the first X detector 260E measures the sum of X and Y displacements of the stage 248. Similarly, the second X detector 262E measures the sum of the X and Y displacements of the stage 248. Further, the Y detector 264E measures the Y displacement of the stage 248. In this embodiment, the control system 224, e.g. a computer system, subtracts the Y displacement received from the Y system 264 from the measurement of the sum of X and Y displacements received from the X detectors 260E, 262E to obtain the X displacement of the stage 248 and the theta Z displacement of the stage 248. For example, the theta Z displacement is obtained by subtracting the X displacement obtained by using the first X detector 260E from the X displacement obtained by using the second X detector 262E. Since the movement of the stage 248 along the X axis is short (small), each system 260, 262, and 264 can direct the measurement beams 260H, 262H, and 264H to the X redirector 260D or 262D or the Y reflector 264D and receive the measurement beams 260H, 262H, and 264H from the X redirector 260D or 262D or the Y reflector 264D regardless of the position of the stage 248 along the X axis. Further, if necessary, the beam sources 260A, 262A, 264A, the optical units 260B, 262B, 264B, the wave plates 260C, 262C, 264C, and the detectors 260E, 262E, 264E can be disposed on the movable table that is able to move synchronously with the stage 248 along the X axis to direct and receive the measurement beam 260H, 262H, 264H to or from the X redirector 260D, 262D, the Y reflector 264D respectively. These matters are common to the other embodiments described and/or illustrated herein.

Figure 2B:
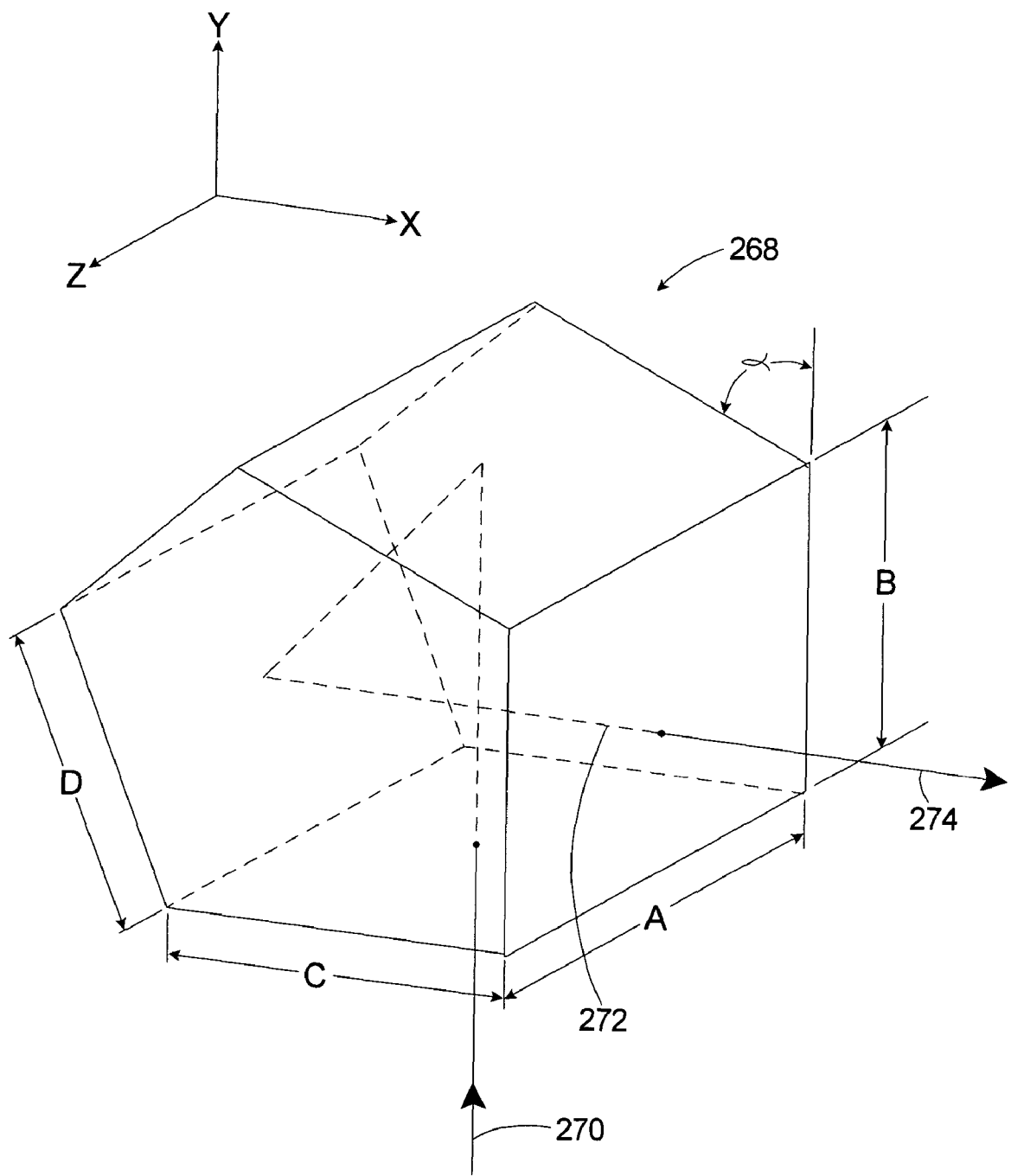
FIG. 2B is a perspective view of a redirector having features of the present invention.

FIG. 2B is a perspective view of one embodiment of a suitable X redirector 268 that can be used as the first X redirector 260D and/or the second X redirector 262D of FIG.

2A, or the other embodiments provided herein. In this embodiment, the X redirector 268 is a penta-prism. In FIG. 2B, line 270 represents an incoming beam, dashed line 272 illustrates the movement of the resulting beam through the penta-prism, and line 274 represents the outgoing beam. In this Figure, the incoming beam 270 is parallel to the Y axis and the outgoing beam 274 is parallel to the X axis. The penta-prism deviates the beam 270 by exactly 90 degrees and does not invert or reverse the beam 270.

The penta-prism is a piece of glass or other transparent material that includes multiple reflecting surfaces that are coated with a metallic reflective coating, a dielectric reflective coating, or another type of reflective coating. The type of reflective coating will depend upon the wavelength of the beam 270 to be reflected. Additionally, the pentagonal surfaces are fine ground.

The dimensions of the penta-prism can vary. For example, in one embodiment, lengths A=B=C and D is longer than lengths A, B, C. In one embodiment, A=B=C=10 mm. and D=10.8 mm. Further, in this embodiment, the angle $\alpha$ is approximately 60°30'.

As provided herein, the X redirector 268 provides an exact 90 degree deviation angle independent of the orientation of the X redirector 268 about the Z axis. Stated another way, the X redirector 268 is insensitive to rotation around the Z axis. As a result thereof, an incoming beam parallel to a first axis (e.g. the Y axis) would always result in an outgoing beam parallel to a second axis (e.g. the X axis) irrespective to the orientation of the X redirector 268. This allows the X redirector 268 to accurately redirect the respective measurement beam 260H, 262H (illustrated in FIG. 2A) regardless of the orientation of the stage 248 (illustrated in FIG. 2A) and the X redirector 268.

For example, in alternative embodiments, an incoming beam 270 parallel to Y-axis would always result in an outgoing beam 274 parallel to X-axis even if the stage and the X redirector 268 are rotated approximately 0.1, 0.2, 0.3, 0.4, 0.5, 1, 1.5, 2, 2.5, or 3 degrees about the Z axis. Stated another way, even if the incoming beam 270 is not normal to the surface that the beam 270 enters, the outgoing beam 274 will be redirected exactly 90 degrees.

Figure 3:
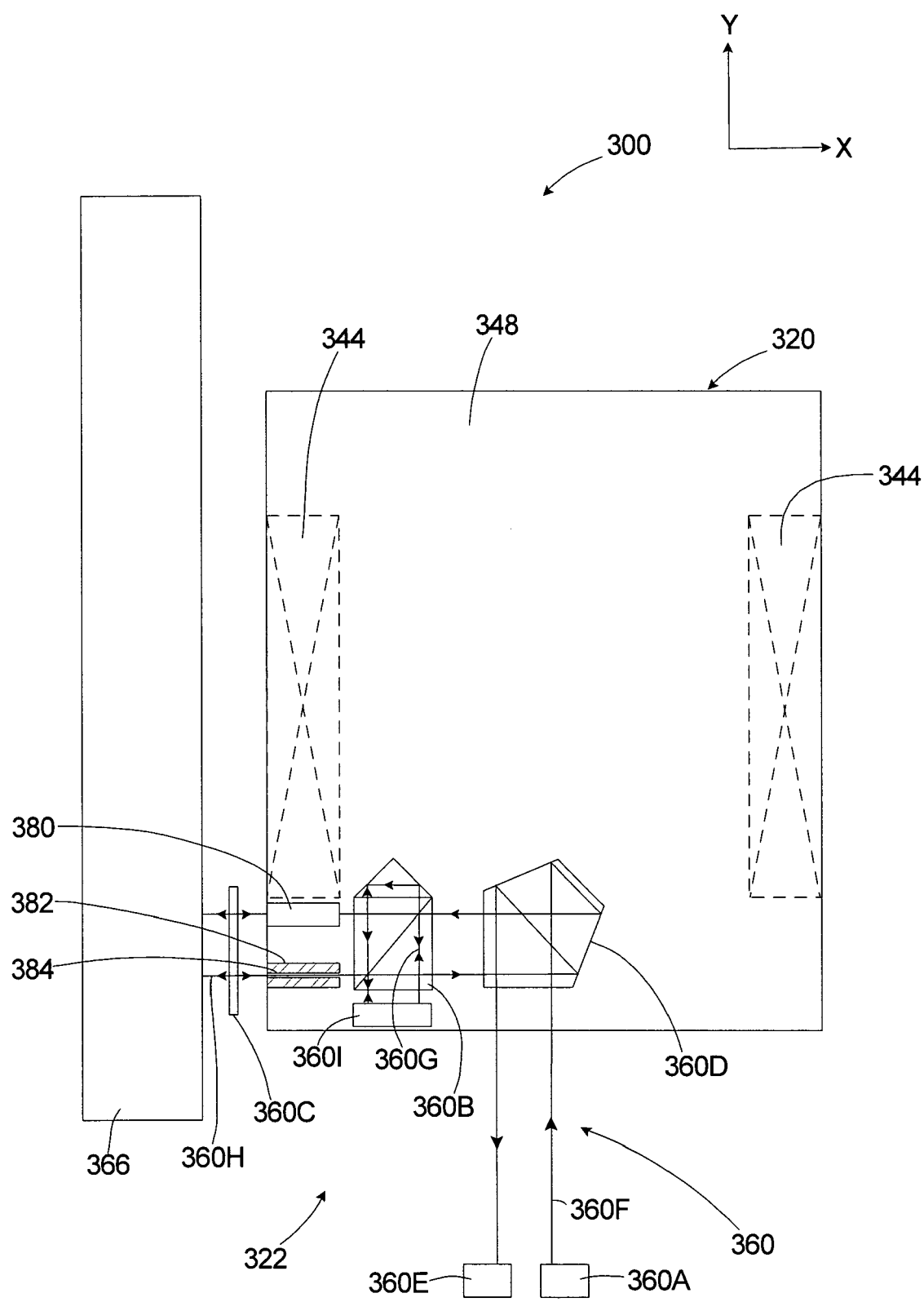
FIG. 3 is a simplified top plan illustration of another embodiment of a stage and a portion of a measurement system having features of the present invention.

FIG. 3 is a simplified illustration of a combination 300 including a stage 348 and a stage mover assembly 344 (illustrated in phantom) of a stage assembly 320 that is used to position a device (not shown in FIG. 3) and a portion of a measurement system 322 having features of the present invention. For example, the stage assembly 320 can be used as the wafer stage assembly 20 or the reticle stage assembly 18 in the exposure apparatus 10 of FIG. 1 or to move another type of device. Further, the stage 348 can be used as the second stage 48 of the wafer stage assemblies 20 or the reticle stage assembly 18 in the exposure apparatus 10 of FIG. 1.

The stage 348 is movable along the X axis with relatively short stroke, along the Y axis with relatively long stroke, and about the Z axis similar to the stage 248 of FIG. 2A, and the stage mover assembly 344 can move the stage 348 along the Z axis, about the X axis and about the Y axis. Alternatively, the stage mover assembly 344 can move the stage 348 along one axis or with six degrees of freedom.

FIG. 3 also illustrates another embodiment of a first X system 360 that can be used in the measurement system 322. In this embodiment, the measurement system 322 can also include a second X system (not shown) and/or one or more Y systems (not shown). As an example, the second X system can be similar to the first X system 360 illustrated in FIG. 3 or the second X system 262 illustrated in FIG. 2, and the Y system (not shown) can be similar to the Y system 262 illustrated in FIG. 2.

In this embodiment, the first X system 360 includes a first X beam source 360A, a first X optical unit 360B, a first X wave plate 360C, a first X redirector 360D, a X reflector 366, and a first X detector 360E that are somewhat similar to the corresponding components described above. However, in this embodiment, the first X optical unit 360B is positioned on the stage 348 and moves with the stage 348 along at least the X direction relative to an X reflector 366, the first X beam source 360A, and the first X detector 360E. Moreover, in this embodiment, the first X optical unit 360B includes a first X reference mirror 360I that is placed on the stage 348. With this design the optical paths of the first X measurement beam 360H and the first X reference beam 360G are independent of the range of motion of the stage 348 along the Y axis. Stated in another way, in this embodiment, most of the optical path of the first X measurement beam 360H is the same as the optical path of the first X reference beam 360G. As a result, the air turbulence disturbance can be minimized. Further, with this design, the first X system 360 directly measures the position of the stage 348 along the X axis, instead of the sum of the X and Y displacement.

Additionally, in the embodiment illustrated in FIG. 3, the first X system 360 includes a first X shield 380 and a second X shield 382 (in cut-away). In this embodiment, each shield 380, 382 is secured to the stage 348 and placed along the optical path of the X measurement beam 360H. In one embodiment, each shield 380, 382 is a tube that defines a shield aperture 384. The X measurement beam 360H is directed through the shield aperture 384. Alternatively, each shield 380, 382 can be a portion of a tube, or a semi-closed tube.

In one embodiment, one or more of the shields 380, 382 can be positioned near areas of disruptive environmental conditions. With this design, the shields 380, 382 reduce the influence of the disruptive environmental conditions on the X measurement beam 360H.

For example, one or more of the shields 380, 382 can be positioned near one or more of the movers of the stage mover assembly 344. In this example, each shield 380, 382 reduces the influence of air turbulence on the first X measurement beam 360H caused by the heat from the movers (for example, a coil member of a linear motor or a voice coil motor) of the stage mover assembly 344 on the measurement beam 360H. Alternatively, one or more shields 380, 382 could be located near other areas of air turbulence, fluctuations in atmosphere, temperature changes and/or density changes.

It should be noted that one or more of the shields 380, 382 can be utilized in one or more of the other embodiments described and/or illustrated herein.

FIGS. 4A–7C illustrate alternative embodiments of combinations 400A–700B having features of the present invention. Each embodiment illustrates an alternative layout of portions of the measurement system 422A–722B. Additionally, each of these embodiments includes a stage 448 and an X reflector 466 that is positioned away from the stage 448.

Figure 4A:
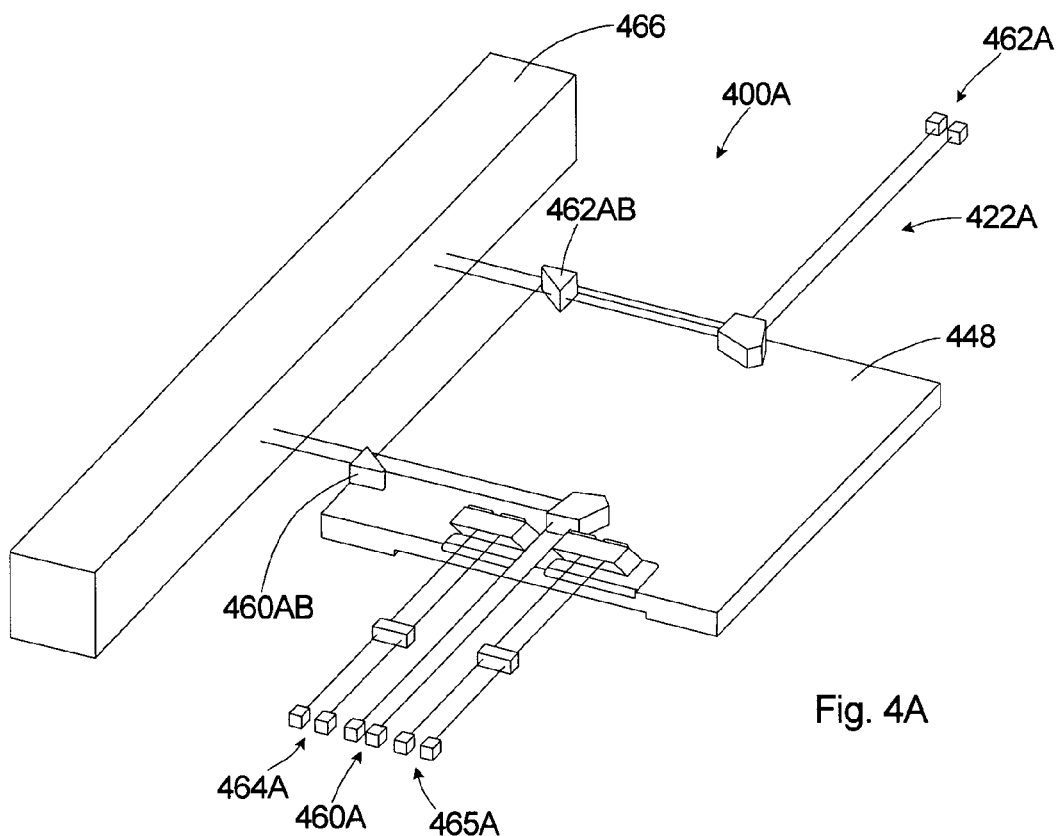
FIG. 4A is a simplified perspective illustration of still another embodiment of a stage and a measurement system having features of the present invention.

In the embodiment illustrated in FIG. 4A, the measurement system 422A of the combination 400A includes a first X system 460A, a second X system 462A, a pair of spaced apart Y systems 464A, 465A that are somewhat similar to the corresponding components described above. In this embodiment, an X optical unit 460AB, 462AB for each X system 460A, 462A is secured to the stage 448. With this design, each X system 460A, 462A directly measures the displacement of the stage 448 along the X axis.

Figure 4B:
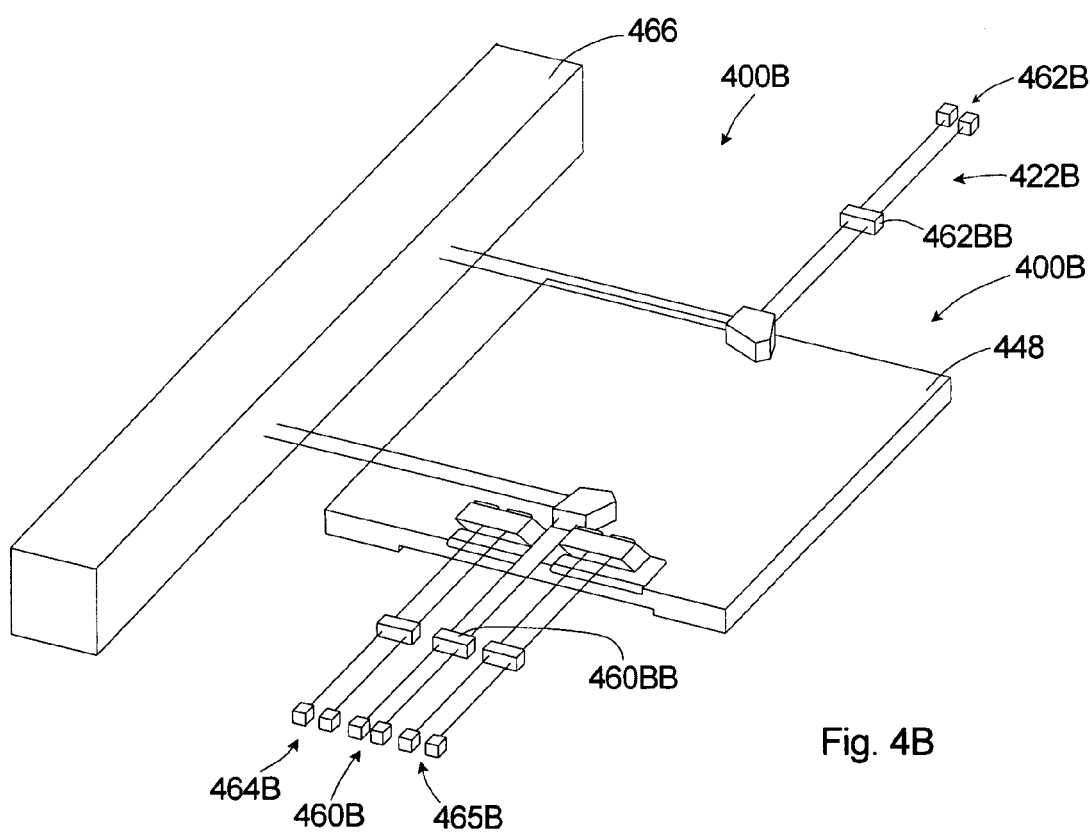
FIG. 4B is a simplified perspective illustration of yet another embodiment of a stage and a measurement system having features of the present invention.

In FIG. 4B, the measurement system 422B of the combination 400B includes a first X system 460B, a second X system 462B, a pair of spaced apart Y systems 464B, 465B that are somewhat similar to the corresponding components described above. In this embodiment, an X optical unit 460BB, 462BB for each X system 460B, 462B is positioned away from the stage 448. With this design, each X system 460B, 462B measures the sum of the displacement of the stage 448 along the X axis and the Y axis.

Figure 5A:
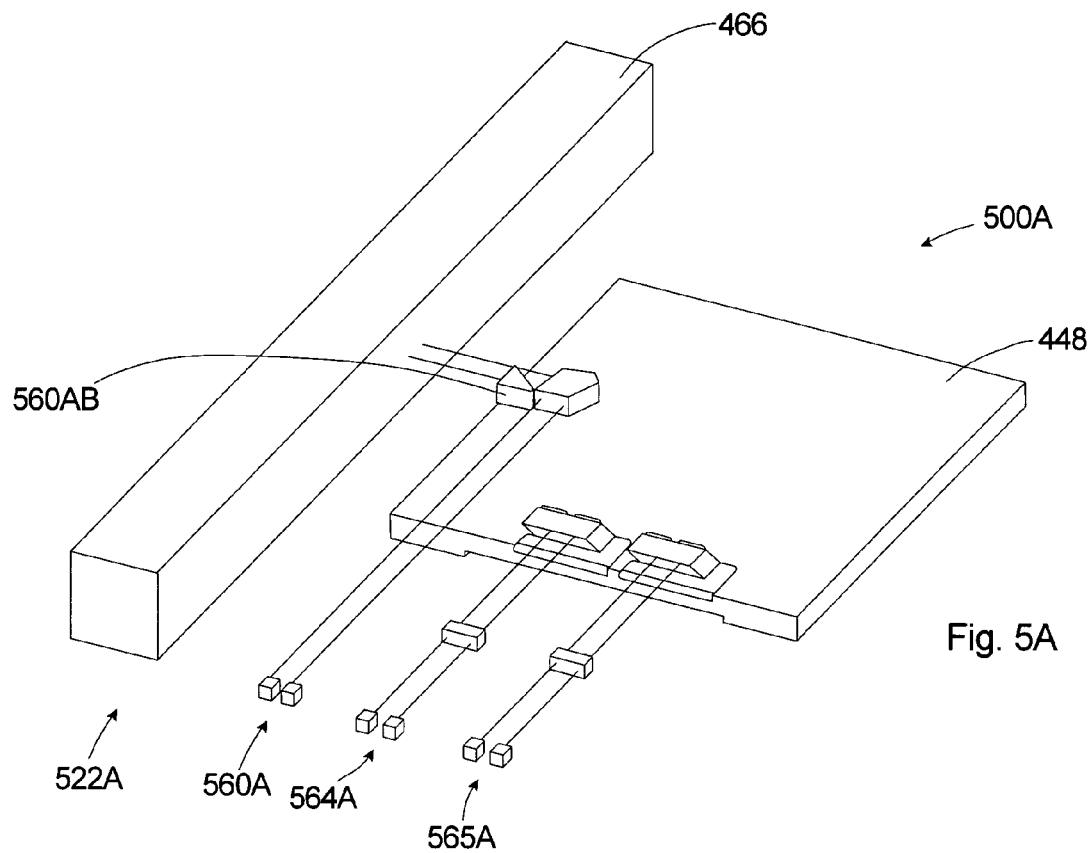
FIG. 5A is a simplified perspective illustration of still another embodiment of a stage and a measurement system having features of the present invention.

In the combination 500A illustrated in FIG. 5A, the measurement system 522A includes a first X system 560A, and a pair of spaced apart Y systems 564A, 565A that are somewhat similar to the corresponding components described above. In this embodiment, an X optical unit 560AB, for the X system 560A is secured to the stage 448. With this design, the X system 560A directly measures the displacement of the stage 448 along the X axis.

Figure 5B:
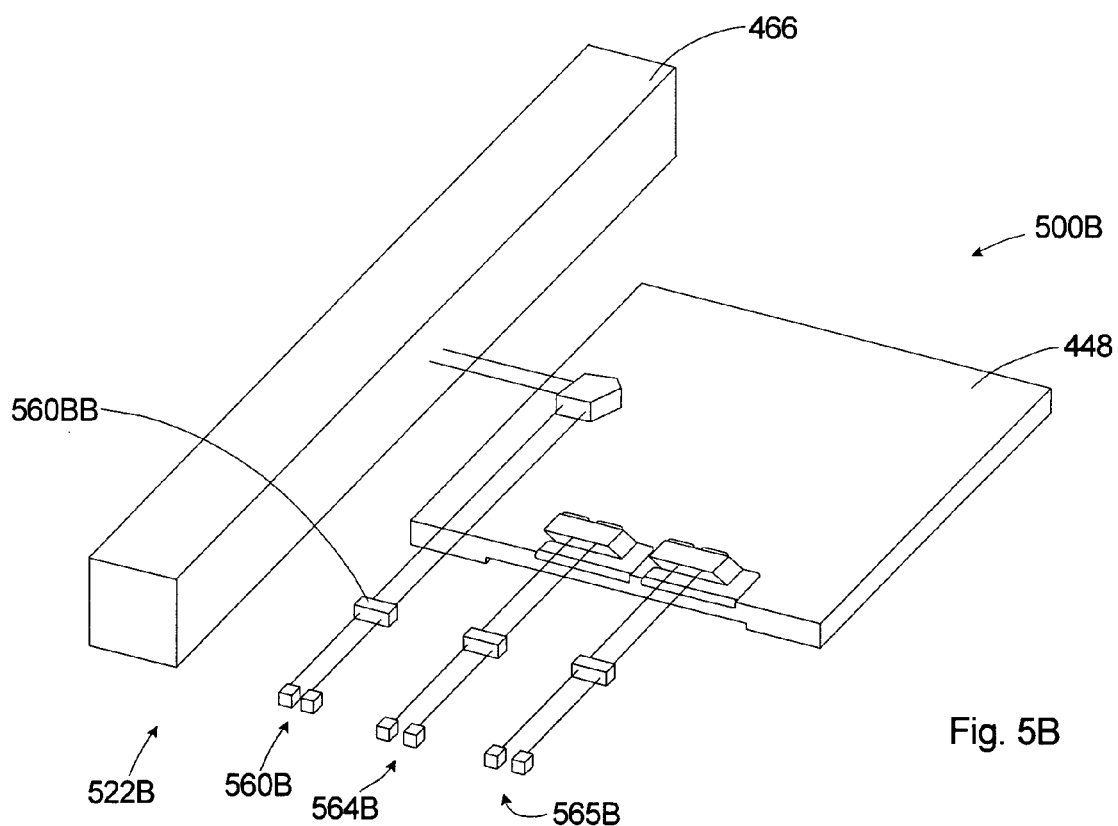
FIG. 5B is a simplified perspective illustration of yet another embodiment of a stage and a measurement system having features of the present invention.

In FIG. 5B, the measurement system 522B of the combination 500B includes a first X system 560B and a pair of spaced apart Y systems 564B, 565B that are somewhat similar to the corresponding components described above. In this embodiment, an X optical unit 560BB for the X system 560B is positioned away from the stage 448. With this design, the X system 560B measures the sum of the displacement of the stage 448 along the X axis and the Y axis. In FIGS. 4A–5B, the measurement system includes a pair of Y systems, the theta Z displacement of the stage 448 will be obtained from the differences between the Y displacement obtained by the pair of Y systems.

Figure 6A:
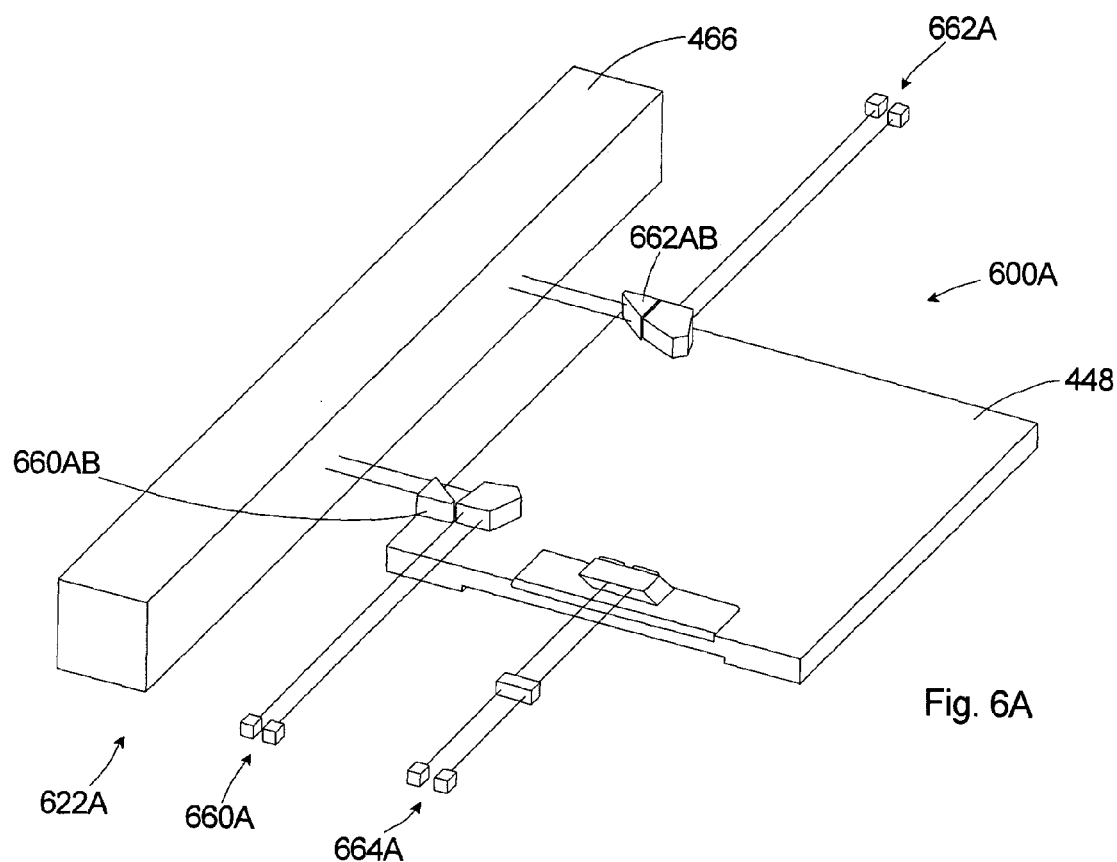
FIG. 6A is a simplified perspective illustration of still another embodiment of a stage and a measurement system having features of the present invention.

In the combination 600A illustrated in FIG. 6A, the measurement system 622A includes a first X system 660A, a second X system 662A, and a Y system 664A that are somewhat similar to the corresponding components described above. In this embodiment, an X optical unit 660AB, 662AB for each X system 660A, 662A is secured to the stage 448. With this design, each X system 660A, 662A directly measures the displacement of the stage 448 along the X axis.

Figure 6B:
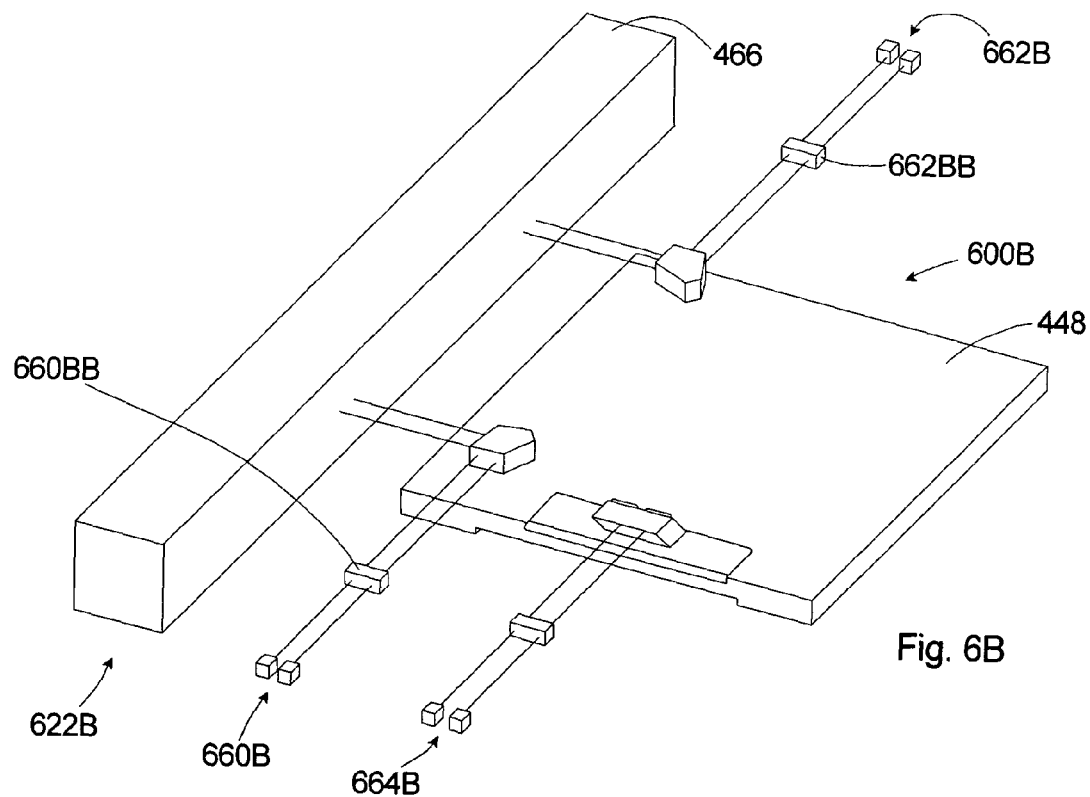
FIG. 6B is a simplified perspective illustration of yet another embodiment of a stage and a measurement system having features of the present invention.

In FIG. 6B, the measurement system 622B of the combination 600B includes a first X system 660B, a second X system 662B, and a Y system 664B that are somewhat similar to the corresponding components described above. In this embodiment, an X optical unit 660BB, 662BB for each X system 660B, 662B is positioned away from the stage 448. With this design, each X system 660B, 662B measures the sum of the displacement of the stage 448 along the X axis and the Y axis.

Figure 7A:
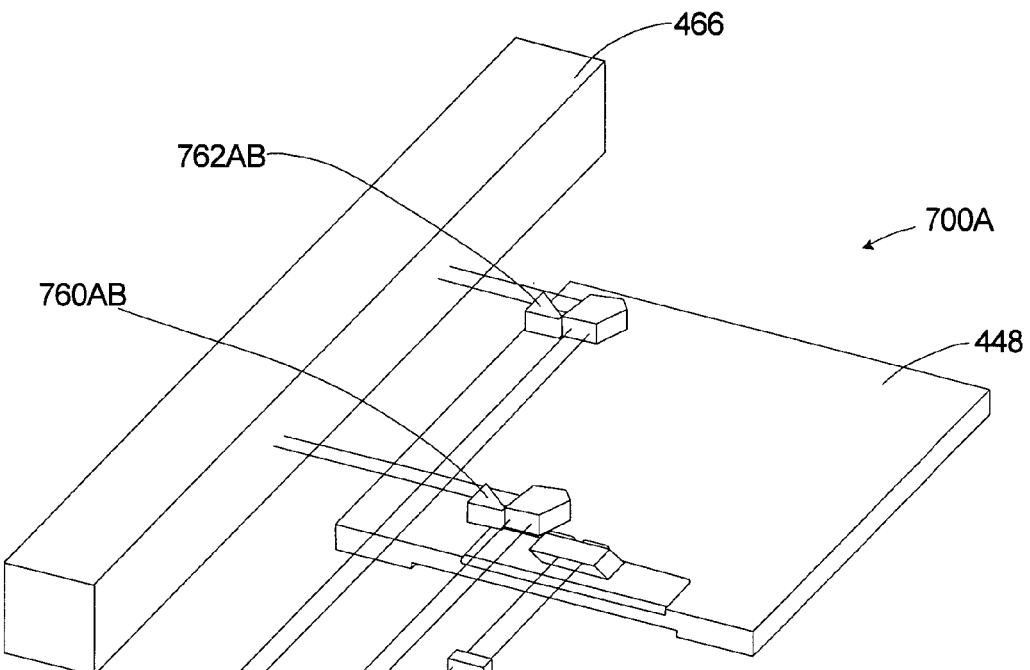
FIG. 7A is a simplified perspective illustration of still another embodiment of a stage and a measurement system having features of the present invention.
Figure 7A:
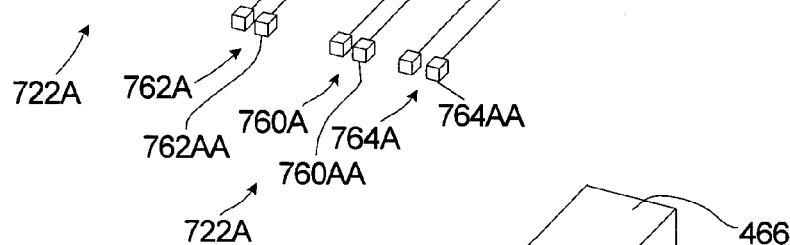

In the combination 700A illustrated in FIG. 7A, the measurement system 722A includes a first X system 760A, a second X system 762, and a Y system 764 that are somewhat similar to the corresponding components described above. In this embodiment, an X optical unit 760AB, 762AB for each X system 760, 762 is secured to the stage 448. With this design, each X system 760A, 762A directly measures the displacement of the stage 448 along the X axis. Further, in this embodiment, a first X beam source 760AA of the first X system 760A, a second X beam source 762AA of the second X system 762A, and a Y beam source 764AA of the Y system 764A are all positioned on the same side of the stage 448. Therefore, the space of the other side of the stage 448 will be wide and freedom for the layout of the stage assembly 18, 20 (shown in FIG. 1) will be increased.

Figure 7B:
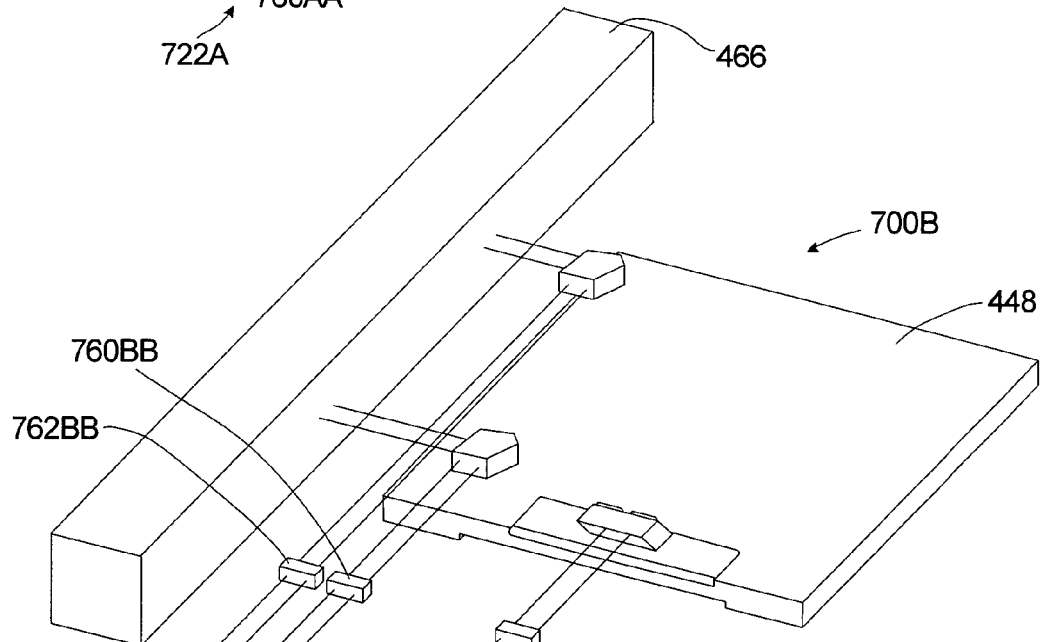
FIG. 7B is a simplified perspective illustration of yet another embodiment of a stage and a measurement system having features of the present invention.
Figure 7B:
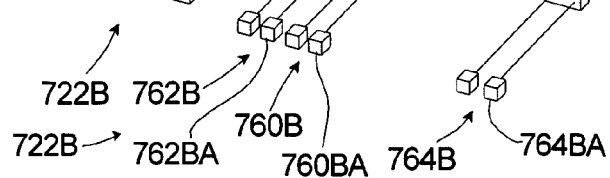

In FIG. 7B, the measurement system 722B of the combination 700B includes a first X system 760B, a second X system 762B, and a Y system 764B that are somewhat similar to the corresponding components described above. In this embodiment, an X optical unit 760BB, 762BB for each X system 760B, 762B is positioned away from the stage 448. With this design, each X system 760B, 762B measures the sum of the displacement of the stage 448 along the X axis and the Y axis. Further, in this embodiment, a first X beam source 760BA of the first X system 760B, a second X beam source 762BA of the second X system 762B, and a Y beam source 764BA of the Y system 764B are all positioned on the same side of the stage 448. Therefore, the space of the other side of the stage 448 will be wide and freedom for the layout of the stage assembly 18, 20 (shown in FIG. 1) will be increased.

Figure 7C:
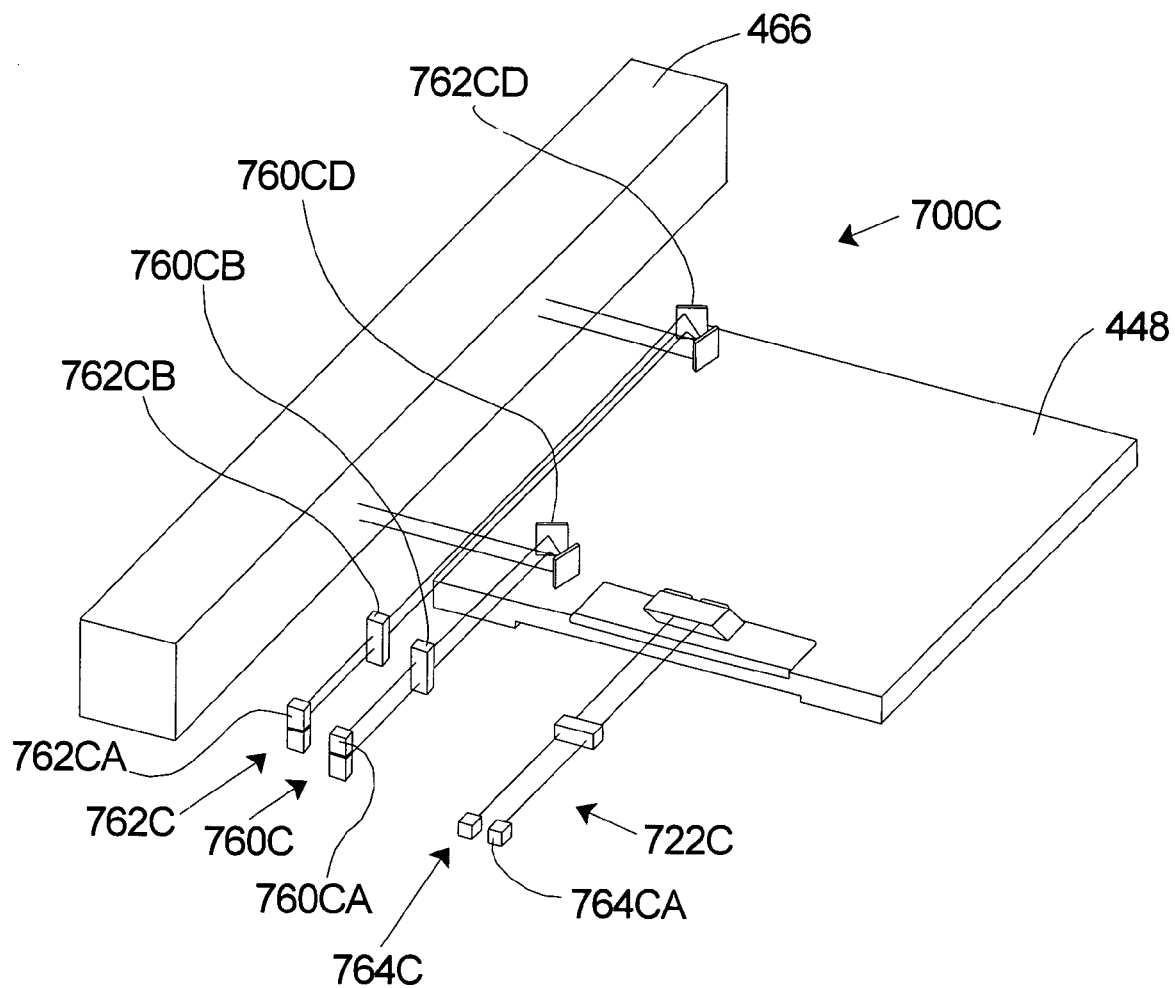
FIG. 7C is a simplified perspective illustration of still another embodiment of a stage and a measurement system having features of the present invention.

In FIG. 7C, the measurement system 722C of the combination 700C includes a first X system 760C, a second X system 762C, and a Y system 764C that are somewhat similar to the corresponding components described above. In this embodiment, an X optical unit 760CB, 762CB for each X system 760C, 762C is positioned away from the stage 448. With this design, each X system 760C, 762C measures the sum of the displacement of the stage 448 along the X axis and the Y axis. Further, in this embodiment, a first X beam source 760CA of the first X system 760C, a second X beam source 762CA of the second X system 762C, and a Y beam source 764CA of the Y system 764C are all positioned on the same side of the stage 448. Therefore, the space of the other side of the stage 448 will be wide and freedom for the layout of the stage assembly 18, 20 (shown in FIG. 1) will be increased.

Additionally, in this embodiment, a first X redirector 760CD of the first X system 760C, and a second X redirector 762CD of the second X system 762C is a penta-mirror comprising two separated mirrors instead of the penta-prism. Further, paths of the beams for the double pass system are arranged in vertical direction for reduce the space for the measurement system.

Figure 8:
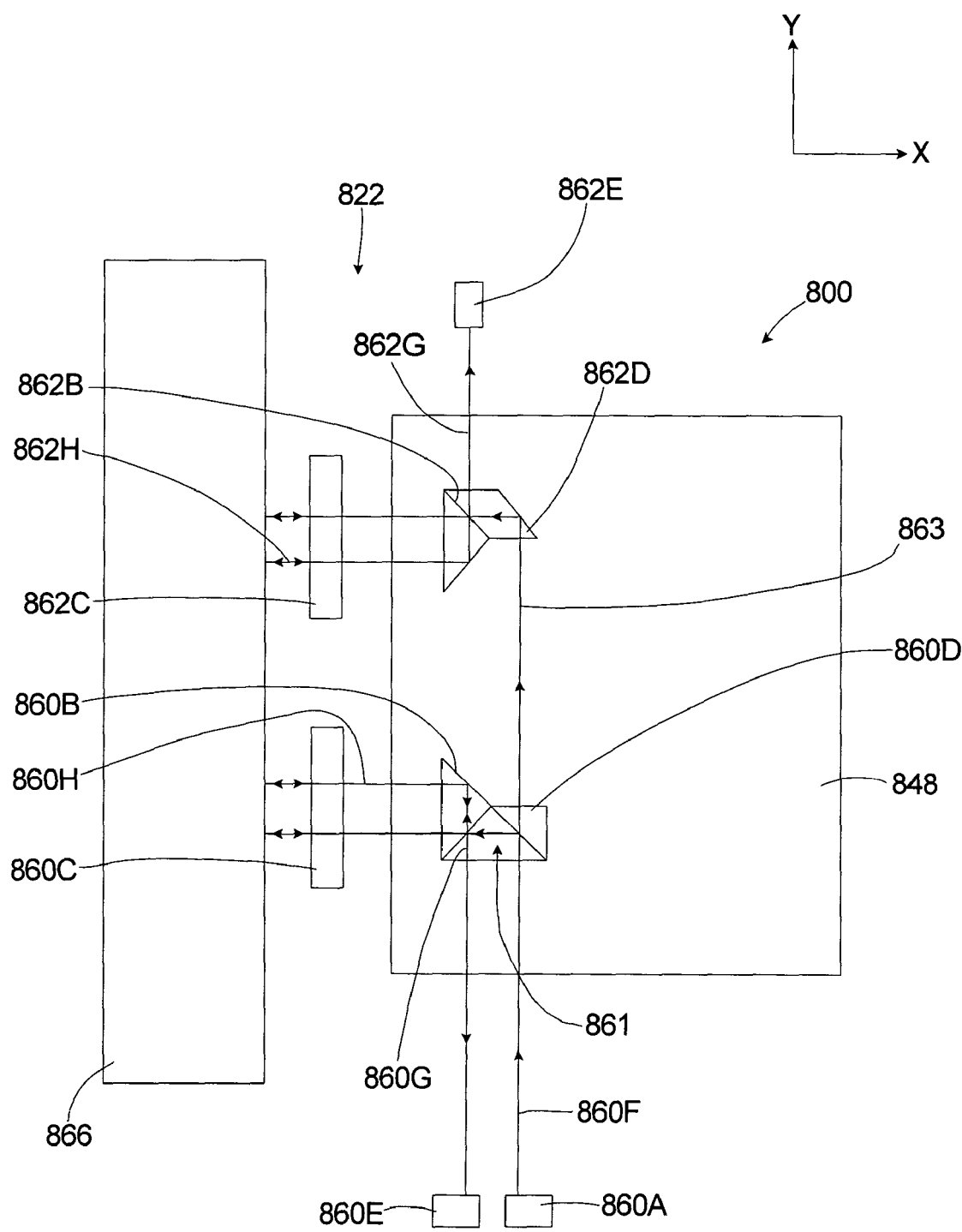
FIG. 8 is a simplified top plan illustration of another embodiment of a stage and a measurement system having features of the present invention.

FIG. 8 is a simplified illustration of another embodiment of a combination 800 having features of the present invention. In this embodiment, the measurement system 822 includes a first X beam source 860A, a first X optical unit 860B, a second X optical unit 862B, a first X wave plate 860C, a second X wave plate 862C, a first X redirector 860D, a second X redirector 862D, a first X detector 860E, a second X detector 862E and a X reflector 866 that are somewhat similar to the corresponding components described above.

In this embodiment, the first X beam source 860A generates a first X beam 860F directed along a first path that is parallel to the Y axis at the first X redirector 860D. The first X redirector 860D redirects a first portion 861 of the first X beam 860F 900 (along the X axis) and allows a second portion 863 of the first X beam 860F to pass through the first X redirector 860D to the second X redirector 862D. The first portion 861 is directed to the first optical unit 860B and split by the first optical unit 860B into a first portion X reference beam 860G and a first portion X measurement beam 860H. The first portion X reference beam 860G is reflected within the first X optical unit 860B and redirected to the first X detector 860E. The first portion X measurement beam 860H is directed parallel to the X axis through the first X wave plate 860C to the X reflector 866. The X reflector 866 reflects the first portion X measurement beam 860H back at the first X optical unit 860B. The first X optical unit 860B reflects the first portion X measurement beam 860H and directs the first portion X measurement beam 860H through the first X wave plate 860C back to the X reflector 866. The X reflector 866 reflects the first portion X measurement beam 860H via the first X wave plate 860C and the first X optical unit 860B to the first X detector 860E.

The second portion 863 travels to the second X redirector 862D. The second X redirector 862D redirects the second portion 863 90° so that the second portion 863 is directed to the second optical unit 862B and split by the second optical unit 862B into a second portion X reference beam 862G and a second portion X measurement beam 862H. The second portion X reference beam 862G is reflected within the second X optical unit 862B and redirected to the second X detector 862E. The second portion X measurement beam 862H is directed parallel to the X axis through the second X wave plate 862C to the X reflector 866. The X reflector 866 reflects the second portion X measurement beam 862H back at the second X optical unit 862B. The second X optical unit 862B reflects the second portion X measurement beam 862H and directs the second portion X measurement beam 862H through the second X wave plate 862C back to the X reflector 866. The X reflector 866 reflects the second portion X measurement beam 862H via the second X wave plate 862C and the second X optical unit 862B to the second X detector 862E.

In this embodiment, each X detector 860E, 862E measures the displacement of the stage 848 along the X axis and the X detectors 860E, 862E cooperate to measure the displacement of the stage 848 about the Z axis.

Figure 9A:
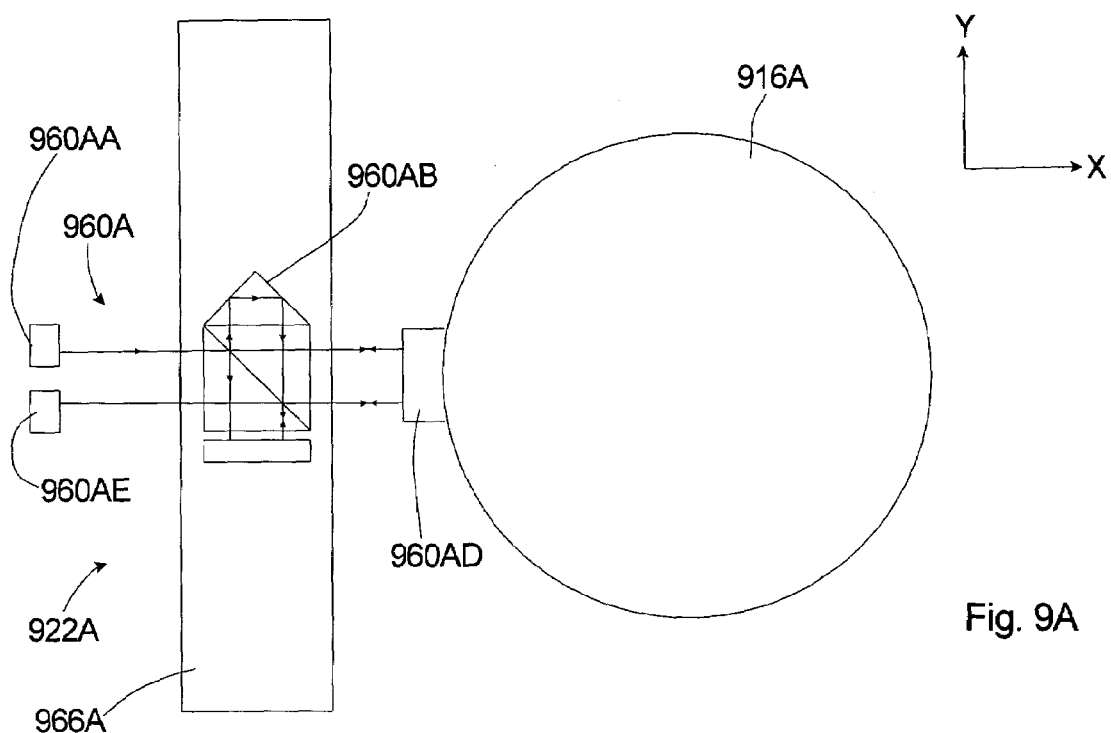
FIG. 9A is a simplified illustration of a portion of a measurement system and an optical assembly having features of the present invention.

In the embodiments described above, because the X reflector 466 is not positioned on the stage 448, the size and weight of the stage 448 can be reduced. This allows more freedom in the overall layout of the stage assembly. FIG. 9A illustrates one embodiment of a portion of the measurement system 922A and an assembly 916A. In this embodiment, the measurement system 922A can include an assembly system 960A that measures the position of a X reflector 966A relative to the assembly 916A so that the position of the stage (not shown in FIG. 9A) along the X axis is referenced to the assembly 916A. For example, the assembly 916A can be the optical assembly 16 (illustrated in FIG. 1). The assembly system 960A can be incorporated into one or more of the combinations illustrated in FIGS. 2A–8B.

In this embodiment, the assembly system 960A includes a beam source 960AA, an optical unit 960AB, a reflector 960AD, and a detector 960AE. Each of these components can be similar to the similar components described above. In this embodiment, the optical unit 960AB is secured to the X reflector 966A and the reflector 960AD is secured to the assembly 916A.

Figure 9B:
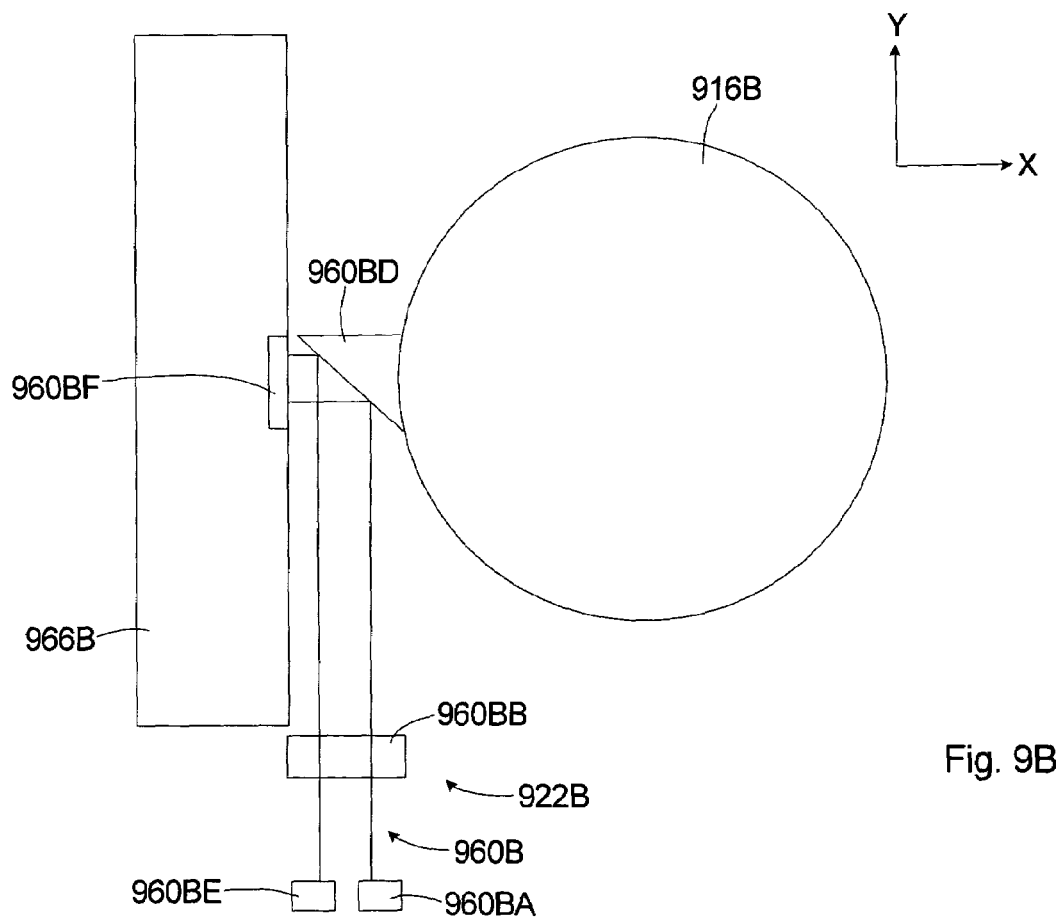
FIG. 9B is a simplified illustration of yet another embodiment of the measurement system and the optical assembly.

FIG. 9B illustrates another embodiment of a portion of the measurement system 922B and an assembly 916B. In this embodiment, the measurement system 922B can include an assembly system 960B that measures the position of X reflector 966B relative to the assembly 916B so that the position of the stage (not shown in FIG. 9B) is referenced to the assembly 916B.

In this embodiment, the assembly system 960B includes a beam source 960BA, an optical unit 960BB, a redirector 960BD, a detector 960BE, and a reflector 960BF. Each of these components can be similar to the similar components described above. In this embodiment, the reflector 960BF is secured to the X reflector 966B and the redirector 960BD is secured to the assembly 916B.

Figure 10A:
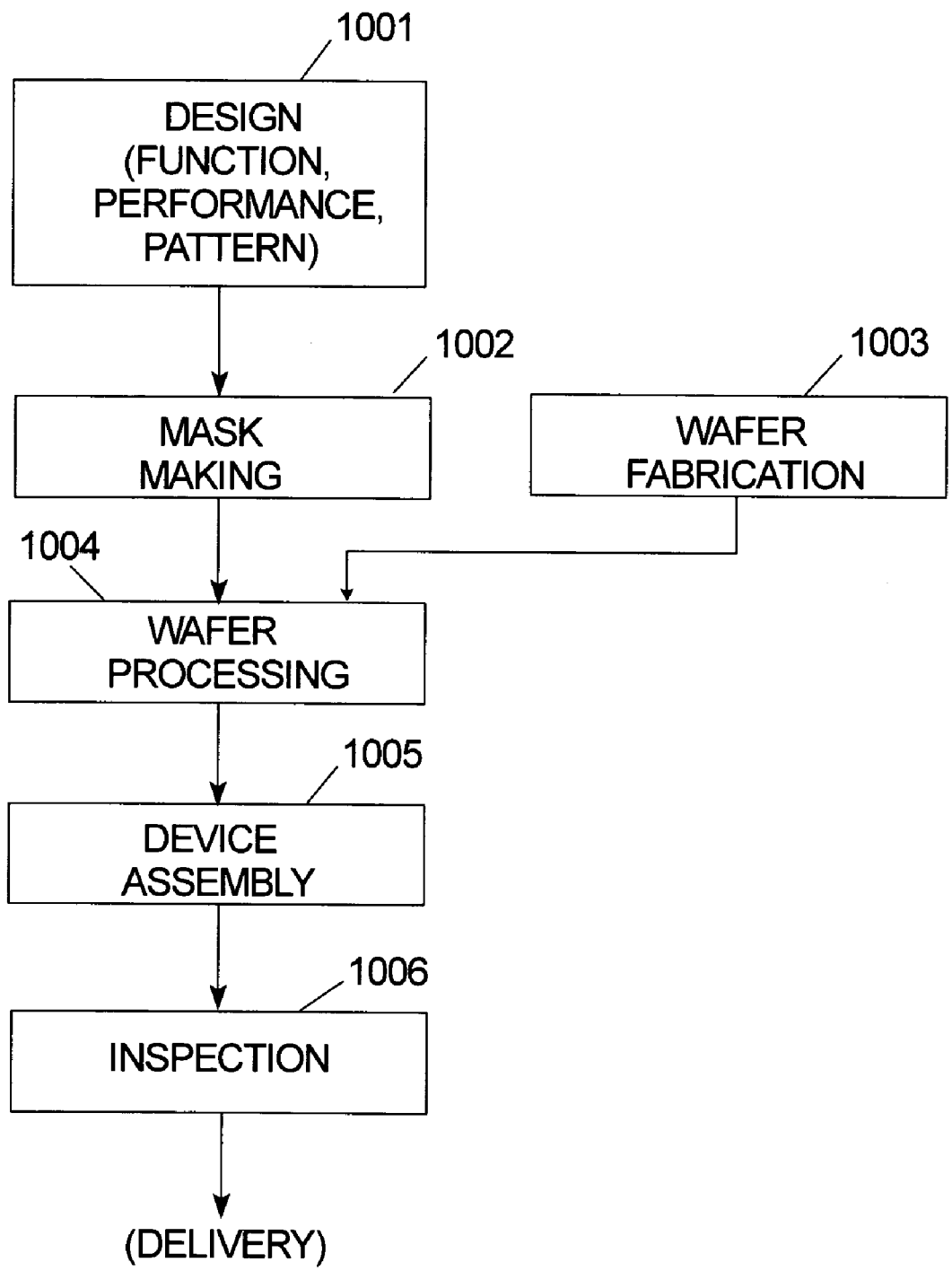
FIG. 10A is a flow chart that outlines a process for manufacturing a device in accordance with the present invention.

Further, semiconductor devices can be fabricated using the above described systems, by the process shown generally in FIG. 10A. In step 1001 the device's function and performance characteristics are designed. Next, in step 1002, a mask (reticle) having a pattern is designed according to the previous designing step, and in a parallel step 1003 a wafer is made from a silicon material. The mask pattern designed in step 1002 is exposed onto the wafer from step 1003 in step 1004 by a photolithography system described hereinabove in accordance with the present invention. In step 1005 the semiconductor device is assembled (including the dicing process, bonding process and packaging process), then finally the device is inspected in step 1006.

Figure 10B:
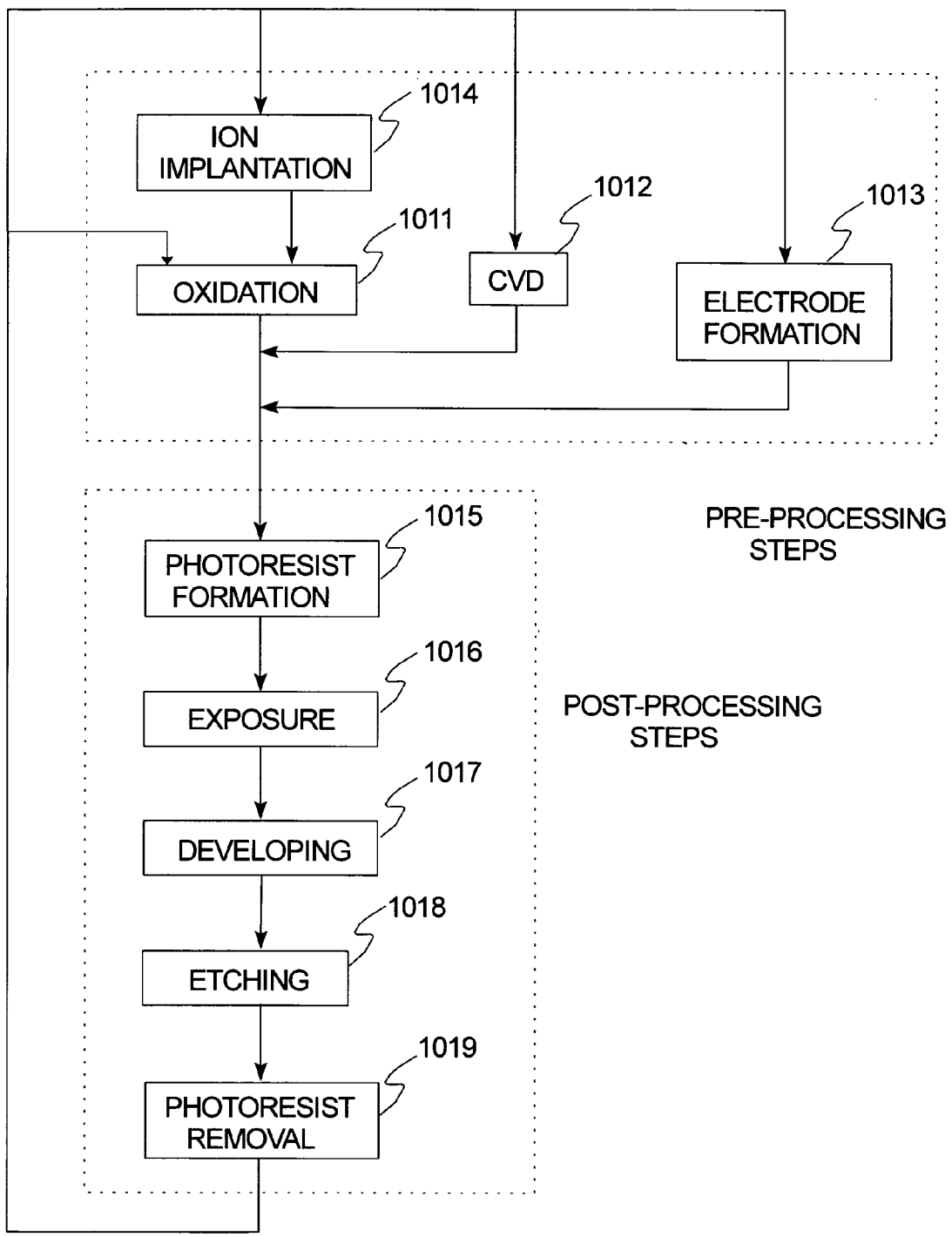
FIG. 10B is a flow chart that outlines device processing in more detail.

FIG. 10B illustrates a detailed flowchart example of the above-mentioned step 1004 in the case of fabricating semiconductor devices. In FIG. 10B, in step 1011 (oxidation step), the wafer surface is oxidized. In step 1012 (CVD step), an insulation film is formed on the wafer surface. In step 1013 (electrode formation step), electrodes are formed on the wafer by vapor deposition. In step 1014 (ion implantation step), ions are implanted in the wafer. The above mentioned steps 1011–1014 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 1015 (photoresist formation step), photoresist is applied to a wafer. Next, in step 1016 (exposure step), the above-mentioned exposure device is used to transfer the circuit pattern of a mask (reticle) to a wafer. Then, in step 1017 (developing step), the exposed wafer is developed, and in step 1018 (etching step), parts other than residual photoresist (exposed material surface) are removed by etching. In step 1019 (photoresist removal step), unnecessary photoresist remaining after etching is removed.

Multiple circuit patterns are formed by repetition of these preprocessing and post-processing steps.

While the particular stage assembly as shown and disclosed herein is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A measurement system for measuring the position of a stage, the measurement system comprising:
a first system comprising a first beam source that directs a first beam on a first path and a first redirector that is secured to the stage, the first redirector redirecting substantially all of the first beam so that the redirected first beam is on a first redirected path that is 90 degrees from the first path even if the first redirector is rotated a small angle about a first axis; wherein the first redirected path is parallel with a second axis, the first path is parallel with a third axis, and the first system measures the sum of the position of the stage along the second axis and along the third axis.

2. The measurement system of claim 1 wherein the first redirector includes a penta-prism.

3. The measurement system of claim 1 further comprising a reflector that is positioned away from the stage, wherein the first redirector redirects the first beam at the first reflector and the reflector reflects the first beam back at the first redirector.

4. The measurement system of claim 1 wherein the first redirected path is 90 degrees from the first path even if the first redirector is rotated approximately 0.1 degree about the first axis.

5. The measurement system of claim 1 wherein the first redirected path is 90 degrees from the first path even if the first redirector is rotated approximately 1 degree about the first axis.

6. The measurement system of claim 1 further comprising an additional system comprising a second beam source that directs a second beam on a second path that is parallel with the first path; and a second redirector that redirects the second beam so that the redirected second beam is on a second redirected path that is 90 degrees from the second path even if the second redirector is rotated approximately 0.1 degree about an axis.

7. The measurement system of claim 1 further comprising a second system that measures the position of the stage along the third axis, wherein the position of the stage along the second axis is calculated by subtracting the position of the stage along the third axis measured by the second system from the sum of the position of the stage measured by the first system.

8. A combination comprising a stage, a stage mover assembly that moves the stage, and the measurement system of claim 1.

9. The combination of claim 8 wherein the first system further comprises a shield that inhibits environmental conditions from influencing the first beam.

10. The combination of claim 9 wherein the shield is secured to the stage.

11. The combination of claim 9 wherein the shield defines a shield aperture and the first beam is directed through the shield aperture.

12. The combination of claim 9 wherein the shield is positioned near at least a portion of the stage mover assembly.

13. The combination of claim 8 further comprising a first optical unit that receives the redirected first beam, the first optical unit being secured to the stage.

14. An exposure apparatus including the combination of claim 8.

15. A process for manufacturing a device including the steps of providing a substrate and transferring an image onto the substrate with the exposure apparatus according to claim 14.

16. A process for manufacturing a wafer including the steps of providing a substrate and transferring an image onto the substrate with the exposure apparatus of claim 14.

17. A measurement system for measuring the position of a stage along a first axis, the measurement system comprising:
a first system comprising a beam source that directs a beam on a path that is parallel to a second axis; and a redirector secured to the stage, the redirector redirecting the beam so that the redirected beam is on a redirected path that is parallel to the first axis, wherein the first system measures the sum of the position of the stage along the first axis and along the second axis, wherein the first redirected path is 90 degrees from the path even if the redirector is rotated approximately 0.1 degree about a third axis.

18. The measurement system of claim 17 wherein the redirector includes a penta-prism.

19. The measurement system of claim 17 further comprising a reflector that is positioned away from the stage, wherein the redirector redirects the beam at the reflector and the reflector reflects the beam back at the redirector.

20. The measurement system of claim 17 further comprising a second system that measures the position of the stage along the second axis, wherein the position of the stage along the first axis is calculated by subtracting the position of the stage along the second axis measured by the second system from the sum of the position of the stage measured by the first system.

21. The measurement system of claim 17 wherein the first system includes an optical unit that is positioned away from the stage.

22. A combination comprising a stage, a stage mover assembly that moves the stage, and the measurement system of claim 17.

23. The combination of claim 22 wherein the first system further comprises a shield that inhibits environmental conditions from influencing the beam.

24. The combination of claim 22 wherein the shield is secured to the stage.

25. The combination of claim 23 wherein the shield defines a shield aperture and the beam is directed through the shield aperture.

26. The combination of claim 22 wherein the shield is positioned near at least a portion of the stage mover assembly.

27. An exposure apparatus including the combination of claim 21.

28. A process for manufacturing a device including the steps of providing a substrate and transferring an image onto the substrate with the exposure apparatus according to claim 26.

29. A process for manufacturing a wafer including the steps of providing a substrate and transferring an image onto the substrate with the exposure apparatus of claim 27.

30. A combination for positioning a device, the combination comprising:
a stage that retains the device;
a stage mover assembly that moves the stage; and
a measurement system for measuring the position of the stage, the measurement system comprising a system including a beam source that directs a beam at the stage and an open-ended shield positioned near at least a portion of the stage mover assembly and adjacent to a path of the beam so that the shield inhibits environmental conditions from influencing the beam.

31. The combination of claim 29 wherein the shield is secured to the stage.

32. The combination of claim 29 wherein the shield defines a shield aperture and the beam is directed through the shield aperture.

33. The combination of claim 30 wherein the system includes a redirector that is secured to the stage, the redirector redirecting the beam 90 degrees even if the redirector is rotated approximately 0.1 degree about an axis.

34. The combination of claim 33 wherein the redirector includes a penta-prism.

35. The combination of claim 20 wherein the system includes a reflector that is positioned away from the stage, wherein the reflector reflects the beam back at the stage.

36. An exposure apparatus including the combination of claim 29.

37. A process for manufacturing a device including the steps of providing a substrate and transferring an image onto the substrate with the exposure apparatus according to claim 36.

38. A process for manufacturing a wafer including the steps of providing a substrate and transferring an image onto the substrate with the exposure apparatus of claim 36.

39. A method for measuring the position of a stage, the method comprising the steps of:

directing a beam on a first path with a beam source; and
redirecting the beam with a redirector that is secured to the stage, the redirector redirecting substantially all of the beam so that the redirected beam is on a redirected path that is 90° from the first path even if the redirector is rotated approximately 0.1° about an axis.

40. The method of claim 39 further comprising the step of positioning a reflector away from the stage, the redirector redirecting the beam at the reflector and the reflector reflecting the beam back at the redirector.

41. The method of claim 39 wherein the redirected path is parallel with a first axis, the first path is parallel with a second axis, and the redirected path is 90° from the first path even if the redirector is rotated approximately 1 degree about a third axis.

42. A method for positioning a device, the method comprising the steps of providing a stage, moving the stage with a stage mover assembly, and measuring the position of the stage by the method of claim 39.

43. The method of claim 42 further comprising the step of securing a shield to the stage that inhibits environmental conditions from influencing the beam.

44. A method for positioning a device, the method comprising the steps of:
providing a stage that retains the device;
moving the stage with a stage mover assembly; and
measuring the position of the stage with a measurement system, the measurement system comprising a beam source that directs a beam at the stage and an open-ended shield positioned near at least a portion of the stage mover assembly and adjacent to a path of the beam so that the shield inhibits environmental conditions from influencing the beam.

45. The method of claim 44 wherein the shield is secured to the stage.

46. The method of claim 44 wherein the shield defines a shield aperture and the beam is directed through the shield aperture.

47. A measurement system that measures the position of a stage along a first axis, the measurement system comprising:
a first system having a first redirector that is secured to the stage, the first system directing a first beam to the first redirector on a first path that is parallel with a second axis, and the first redirector redirecting the first beam on a first redirected path that is parallel with the first axis;
a reflector that is positioned away from the stage, the reflector extending along the second axis; wherein
the first redirector redirects the first beam at the reflector and the reflector reflects the first beam back at the first redirector, and the first redirector redirects the first beam on a second redirected path that is parallel with the second axis; and wherein
the first redirector is configured to be insensitive to the rotation around a third axis that is orthogonal to the first and second axes about the direction redirecting the first beam from the first path; and
a detector that is positioned away from the stage, the detector detecting the first beam after the first beam has been redirected on the second redirected path by the first redirector.

48. The measurement system of claim 46 further comprising an additional system including a second redirector that is secured to the stage, the additional system directing a second beam to the second redirector on a second path that is parallel with the second axis, and the second redirector redirecting the second beam on a second redirected path that is parallel with the first axis; wherein
the second redirector redirects the second beam at the reflector and the reflector reflects the second beam back at the second redirector; and
the second redirector is configured to be insensitive to the rotation around the third axis about the direction redirecting the second beam from the second path.

49. The measurement system of claim 46 wherein the first redirector includes a penta-prism.

50. The measurement system of claim 46 wherein the first redirector includes a penta-mirror.

51. A combination comprising a stage, a stage mover assembly that moves the stage, and the measurement system of claim 46.

52. An exposure apparatus comprising the combination of claim 47 and an irradiation apparatus that irradiate a photosensitive substrate held by the stage with radiation to form an image on the photosensitive substrate, wherein the axis of the radiation irradiated to the photosensitive substrate is substantially parallel with the third axis.

53. A method for exposing a substrate, comprising the steps of:
retaining the substrate on a stage;
moving the stage by a stage mover assembly;
measuring the position of the stage by a measurement system, the measurement system comprising a system including a beam source that directs a beam at the stage and an open-ended shield positioned near at least a position of the stage mover assembly and adjacent to a path of the beam so that the shield inhibits environmental conditions from influencing the beam; and
irradiating an energy beam to the substrate.

54. A method according to claim 53, wherein the shield is secured to the stage.

55. A method according to claim 53, wherein the shield defines a shield aperture and the beam is directed through the shield aperture.

56. A method according to claim 53, wherein the system includes a reflector that is positioned away from the stage, wherein the reflector reflects the beam back at the stage.

57. A method of making an exposure apparatus that irradiates an energy beam to a substrate, comprising the steps of:
providing a stage that retains the substrate;
providing a stage mover assembly that moves the stage; and
providing a measurement system for measuring the position of the stage, the measurement system comprising a system including a beam source that directs a beam at the stage and an open-ended shield positioned near at least a portion of the stage mover assembly and adjacent to a path of the beam so that the shield inhibits environmental conditions from influencing the beam.

58. A method according to claim 57, wherein the shield is secured to the stage.

59. A method according to claim 57, wherein the shield defines a shield aperture and the beam is directed through the shield aperture.

60. A method according to claim 57, wherein the system includes a reflector that is positioned away from the stage, wherein the reflector reflects the beam back at the stage.

* * * * *

UNITED STATES PATENT AND TRADEMARK OFFICE
CERTIFICATE OF CORRECTION

PATENT NO. : 7,283,200 B2  Page 1 of 1
APPLICATION NO. : 10/623004
DATED : October 16, 2007
INVENTOR(S) : Alex Ka Tim Poon et al.

It is certified that error appears in the above-identified patent and that said Letters Patent is hereby corrected as shown below:

In the Claims:

Column 17, Line 56, delete "first".

Column 18, Line 14, delete "22" and substitute --23--.
Column 18, Line 19, delete "22" and substitute --23--.
Column 18, Line 23, delete "21" and substitute --22--.
Column 18, Line 27, delete "26" and substitute --27--.
Column 18, Line 42, delete "29" and substitute --30--.
Column 18, Line 44, delete "29" and substitute --30--.
Column 18, Line 53, delete "20" and substitute --30--.
Column 18, Line 57, delete "29" and substitute --30--.

Column 19, Line 63, delete "46" and substitute --47--.

Column 20, Line 10, delete "46" and substitute --47--.
Column 20, Line 12, delete "46" and substitute --47--.
Column 20, Line 16, delete "46" and substitute --47--.
Column 20, Line 18, delete "47" and substitute --51--.

Signed and Sealed this

Twenty-fifth Day of December, 2007

JON W. DUDAS
*Director of the United States Patent and Trademark Office*